(12) United States Patent
Ashjaee et al.

(10) Patent No.: US 7,059,944 B2
(45) Date of Patent: Jun. 13, 2006

(54) INTEGRATED SYSTEM FOR PROCESSING SEMICONDUCTOR WAFERS

(75) Inventors: Jalal Ashjaee, Cupertino, CA (US); Boris Govzman, Sunnyvale, CA (US); Bernard M. Frey, Livermore, CA (US); Boguslaw A. Nagorski, San Jose, CA (US); Douglas W. Young, Sunnyvale, CA (US); Bulent M. Basol, Manhattan Beach, CA (US); Homayoun Talieh, San Jose, CA (US)

(73) Assignee: ASM Nutool, Inc., Fremont, CA (US)

( * ) Notice: Subject to any disclaimer, the term of this patent is extended or adjusted under 35 U.S.C. 154(b) by 47 days.

(21) Appl. No.: 10/369,118

(22) Filed: Feb. 18, 2003

(65) Prior Publication Data

US 2003/0166382 A1 Sep. 4, 2003

Related U.S. Application Data

(63) Continuation-in-part of application No. 09/795,687, filed on Feb. 27, 2001, now Pat. No. 6,953,392.

(60) Provisional application No. 60/357,148, filed on Feb. 15, 2002, provisional application No. 60/397,740, filed on Jul. 20, 2002.

(51) Int. Cl.
*B24B 1/00* (2006.01)

(52) U.S. Cl. .......................................... 451/54; 451/67
(58) Field of Classification Search ................. 451/36, 451/37, 41, 54, 57, 59, 63, 65, 66, 67, 331, 451/339; 234/33, 34, 85
See application file for complete search history.

(56) References Cited

U.S. PATENT DOCUMENTS

| | | | |
|---|---|---|---|
| 5,620,578 A | 4/1997 | Hurwitt | |
| 5,679,059 A * | 10/1997 | Nishi et al. | 451/41 |
| 5,826,129 A * | 10/1998 | Hasebe et al. | 396/611 |
| 5,827,110 A * | 10/1998 | Yajima et al. | 451/5 |
| 5,830,045 A | 11/1998 | Togawa et al. | |
| 5,885,138 A | 3/1999 | Okumura et al. | |
| 5,954,072 A * | 9/1999 | Matusita | 134/149 |
| 5,972,110 A | 10/1999 | Akimoto | |
| 6,110,011 A | 8/2000 | Somekh et al. | |
| 6,122,566 A | 9/2000 | Nguyen et al. | |
| 6,132,289 A * | 10/2000 | Labunsky et al. | 451/6 |
| 6,136,163 A | 10/2000 | Cheung et al. | |
| 6,224,638 B1 | 5/2001 | Jevtic et al. | |
| 6,251,759 B1 | 6/2001 | Guo et al. | |
| 6,368,880 B1 | 4/2002 | Singhvi et al. | |

(Continued)

FOREIGN PATENT DOCUMENTS

EP  0 978 867  2/2000

(Continued)

*Primary Examiner*—Timothy V. Eley
(74) *Attorney, Agent, or Firm*—Knobbe Martens Olson & Bear LLP

(57) ABSTRACT

An integrated process tool for chemical mechanical processing, cleaning and drying a semiconductor workpiece is provided. The integrated process tool includes a CMP module and a cleaning and drying module. After being processed, the workpiece is transported from the CMP module to the cleaning and drying module using a movable housing. In the cleaning and drying module, a cleaning mechanism is used to clean the workpiece while the workpiece is rotated and held by a support stucture of the movable housing. A drying mechanism of the cleaning and drying module picks up the workpiece from the moveable housing and spin dries it. Throughout the CMP process, cleaning and drying, the processed surface of the wafer faces down.

16 Claims, 15 Drawing Sheets

U.S. PATENT DOCUMENTS

| | | |
|---|---|---|
| 6,409,576 B1 * | 6/2002 | Oguri et al. ............... 451/6 |
| 6,468,022 B1 * | 10/2002 | Whitcomb ............... 414/757 |
| 6,494,985 B1 | 12/2002 | Sotozaki et al. |
| 6,578,853 B1 * | 6/2003 | Treur et al. ............... 279/121 |
| 6,613,200 B1 | 9/2003 | Li et al. |
| 6,736,929 B1 | 5/2004 | Komandur et al. |
| 6,857,838 B1 * | 2/2005 | Kuroda ............... 198/394 |

FOREIGN PATENT DOCUMENTS

| EP | 1 037 263 | 9/2000 |
|---|---|---|
| WO | WO 200229861 | 4/2002 |

* cited by examiner

INTEGRATED SYSTEM FOR PROCESSING SEMICONDUCTOR WAFERS

RELATED APPLICATIONS

This application is a continuation in part of U.S. application Ser. No. 09/795,687 filed Feb. 27, 2001 (NT-202) now U.S. Pat. No. 6,953,392, and this application claims priority from Provisional Application Ser. No. 60/357,148 filed Feb. 15, 2002 (NT-228), and Provisional Application Ser. No. 60/397,740 filed Jul. 20, 2002 (NT-255), all incorporated herein by reference.

FIELD

The present invention relates to semiconductor processing technologies and, more particularly, to an integrated system for processing semiconductor wafers. The invention also includes individual process modules for performing specific tasks, for example, a workpiece cleaning and drying module.

BACKGROUND

In the semiconductor industry, various processes can be used to deposit and etch materials on wafers. Deposition techniques include processes such as electrochemical deposition (ECD) and electro chemical mechanical deposition (ECMD). In both processes, a conductor is deposited on a semiconductor wafer or workpiece by having electrical current carried through an electrolyte that comes into contact with the surface of the workpiece (cathode). The ECMD process is able to uniformly fill the holes and trenches on the surface of the workpiece with the conductive material while maintaining the planarity of the surface. A more detailed description of the ECMD method and apparatus can be found in the U.S. Pat. No. 6,176,992, entitled "Method and Apparatus For Electro Chemical Mechanical Deposition", commonly owned by the assignee of the present invention.

If a conventional plating process is performed to deposit the conductive material in a deposition chamber, the workpiece may be transferred to another chamber in the cluster tool for chemical mechanical polishing (CMP). As is known, the material removal can also be carried out using electrochemical etching by making the workpiece anodic (positive) with respect to an electrode after completing an ECD or ECMD process.

Regardless of which process is used, the workpiece is next transferred to a rinsing/cleaning station or module after the deposition and/or polishing steps. During the rinsing/cleaning step, various residues generated by the deposition and/or polishing processes are rinsed off the workpiece with a fluid such as de-ionized water or de-ionized water with small amounts of other cleaning and/or passivating agents, and subsequently the workpiece is dried.

Conventionally, processing chambers are designed in multiple processing stations or modules that are arranged in a cluster to form a cluster tool or system. Such cluster tools or systems are often used to process a multiple number of workpieces at the same time. Generally, cluster tools are configured with multiple processing stations or modules and are designed for a specific operation. However, in such conventional cluster tools, deposition and cleaning processing steps both typically require separate chambers. For this reason, in known cluster tools, for a workpiece to be processed and cleaned, it must be moved to another station or system. Thus, such configured systems require picking workpieces from a particular processing environment and placing them into a cleaning environment. The workpiece can be cleaned and dried in a cleaning and a drying module using, for example, a rinse and spin process, as known in the art.

When the workpiece is transferred to the cleaning and drying module, contaminants may have attached themselves on the workpiece surface. The source of these contaminants may be the plating/polishing agent, transferring mechanism, surrounding air, the processing facility, personnel, process chemicals, and the like. The workpiece surface should be free of such contaminants; otherwise, the contaminants may affect device performance characteristics and may cause device failure to occur at faster rates than usual.

The speed of which the workpiece is transferred from one module to the next is also critical. As is well known in the semiconductor industry, the production line for manufacturing the workpiece from beginning to end must be performed in the most efficient manner.

SUMMARY OF THE INVENTION

The present invention is directed to a novel cleaning and drying module of the overall cluster tool. The present invention further provides a more cost effective, efficient, contaminant free method and apparatus for cleaning and dying workpieces than those currently available.

In one aspect of the present invention, an apparatus for processing, cleaning and drying a semiconductor workpiece is provided. The apparatus includes a process area to process a surface of the workpiece and a cleaning drying area to clean and dry the workpiece. A movable housing transports the workpiece from the process area to a cleaning and drying area. The movable housing includes a support structure adapted to hold the workpiece. A cleaning mechanism cleans the workpiece while the workpiece is rotated and held by the support structure. A drying mechanism receives the workpiece from the moveable housing for drying the workpiece. The workpiece is held and cleaned and dried while the processed surface of the workpiece faces down.

In another aspect of the present invention, a method for cleaning and drying a workpiece in a process module, that has a cleaning and drying section and a process section, is provided. The method includes placing the workpiece on a movable housing, moving the movable housing into the cleaning and drying section of the process module, cleaning a surface of the workpiece using a cleaning fluid in the cleaning and drying section, transferring the workpiece from the moveable housing to a drying mechanism having a spinning wheel and drying the workpiece. Before the step of placing the workpiece onto the movable housing, the surface of the workpiece is processed in the process section adjacent the cleaning and drying section of the process module prior to the step of placing.

DETAILED DESCRIPTION

Figure 1:
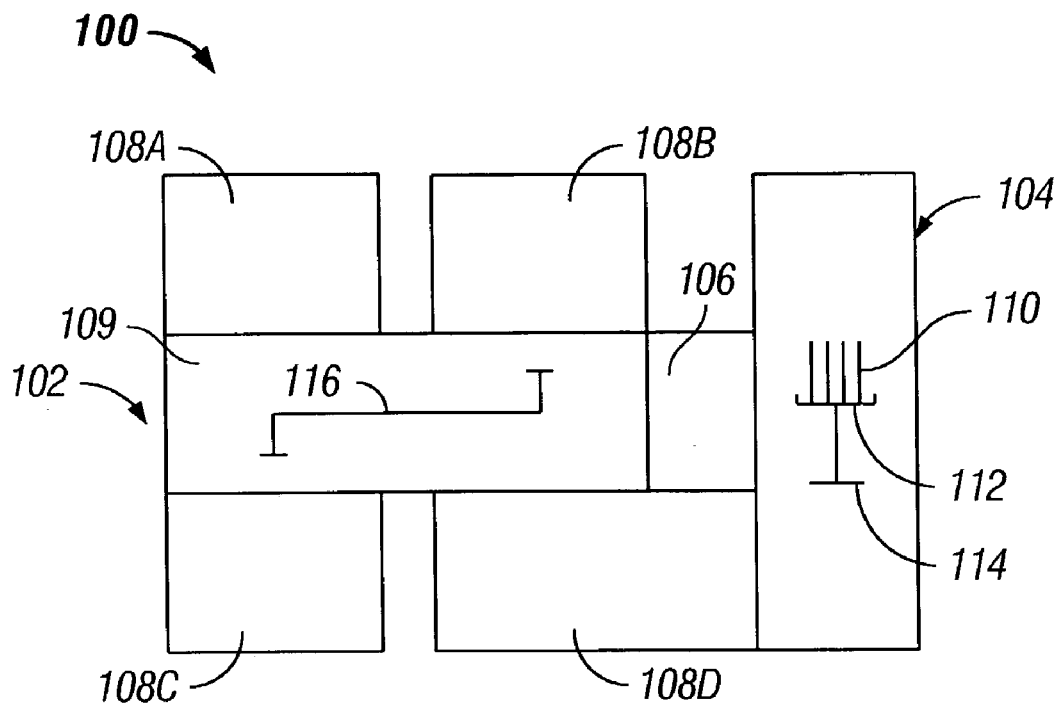
FIG. 1 is a schematic illustration of a system of the present invention including an embodiment of an integrated chemical mechanical process station of the present invention.

The present invention will now be described in greater detail, which will serve to further the understanding of the preferred embodiments of the invention. As described elsewhere herein, various refinements and substitutions of the various embodiments are possible based on the principles and teachings herein.

The preferred embodiments of the present invention will be described with reference to FIGS. 1–17, wherein like components, parts, rollers, gears, tracks, motors, bars, etc. are designated by like reference numbers throughout the various figures. Further, specific parameters and components are provided herein, which are intended to be explanatory rather than limiting.

The preferred embodiments will be described using the example of a workpiece or wafer, but different applications such as packaging, flat panel displays, and magnetic heads can be used with the present invention. The present invention describes a workpiece cleaning and drying module. The cleaning and drying module of the present invention is capable of processing workpieces with different diameters at different times, but will typically process workpieces of the same size for a given processing run. The workpiece can be transferred from a plating or polishing processing module using a movable housing.

The present invention provides a system for semiconductor device fabrication. The system comprises several process modules to perform process steps such as Electrochemical Mechanical Processing (ECMPR), electrochemical deposition (ECD), chemical mechanical polishing (CMP) and electrochemical polishing (EC-polishing) integrated with other process steps such as cleaning, edge bevel removal and drying. The term of Electrochemical Mechanical Processing (ECMPR) is used to include both Electrochemical Mechanical Deposition (ECMD) processes as well as Electrochemical Mechanical Etching (ECME), which is also called Electrochemical Mechanical Polishing (ECMP). It should be noted that in general both ECMD and ECME processes are referred to as electrochemical mechanical processing (ECMPR) since both involve electrochemical processes and mechanical action.

Additionally, an integrated tool of the present invention is designed to utilize these process modules to perform multiple processing steps related to electrochemical deposition, chemical mechanical polishing, and electrochemical polishing.

Following the ECD, ECMP, CMP or electrochemical polishing processes, the electrolyte residues need to be rinsed off the wafer, and subsequently wafer needs to be dried. Additionally, after such processes, it may be necessary to remove a portion of the metal that is deposited near the edge of the wafer surface. This process is often referred to as 'bevel edge clean' or 'edge removal' step. In the present invention, certain exemplary process chambers, i.e., ECD, ECMPR, or electrochemical polishing chambers, and their respective cleaning chambers are stacked vertically, although there is also described herein an additional CMP chamber in which the cleaning chamber is horizontally disposed from the chemical mechanical polishing area. The edge removal step may be carried out in the cleaning chamber, whether such cleaning chamber is vertically disposed with respect to the process or not. In the context of this application, the cleaning chamber is the chamber where cleaning (using a fluid such as water or the like to remove residues therefrom) and drying and possibly edge removal process steps are performed.

FIG. 1 illustrates an integrated tool 100 or system of the present invention which comprises a wafer processing section 102 and a load/unload section 104 or a cassette section connected to the processing section 102 through a buffer section 106. The processing section 102 may comprise one or more electrochemical mechanical process stations or subsystems 108A–108C and one or more chemical mechanical polishing process stations or subsystems 108D, which are each configured with respect to a wafer handling section 109 within the wafer processing section 102, as in the manner shown in FIG. 1. In this embodiment, the process stations 108A–108C may preferably be vertically stacked chambers that have both an electrochemical mechanical deposition (ECMD) chamber and a cleaning chamber (i.e., ECMD/cleaning chamber).

As so configured, the integrated tool 100 of the present invention is able to process wafers with different diameters at different times, but will typically process wafers of only the same size for a given processing run. An exemplary vertical chamber design and operation for the process chambers 108A–108C is disclosed in the U.S. Pat. No. 6,352,623, entitled "Vertically Configured Chamber Used for Multiple Processes", commonly owned by the assignee of the present invention.

In a preferred sequence of operations, wafers 110 or workpieces to be plated are delivered to the cassette section 104 in a cassette 112 and then each may be picked up and transferred to the buffer section 106 by a first robot 114. Each wafer 110 can then be transferred to one of the processing stations 108A–108C in the processing section 102 by a second robot 116. As mentioned above, the processing stations 108A–108D can be either adapted to process 200 or 300 millimeter (mm) wafers, or other size workpiece if desired. After the electro chemical mechanical deposition and cleaning processes are complete, each wafer is transferred into the chemical mechanical polishing processing station 108D.

Figure 4:
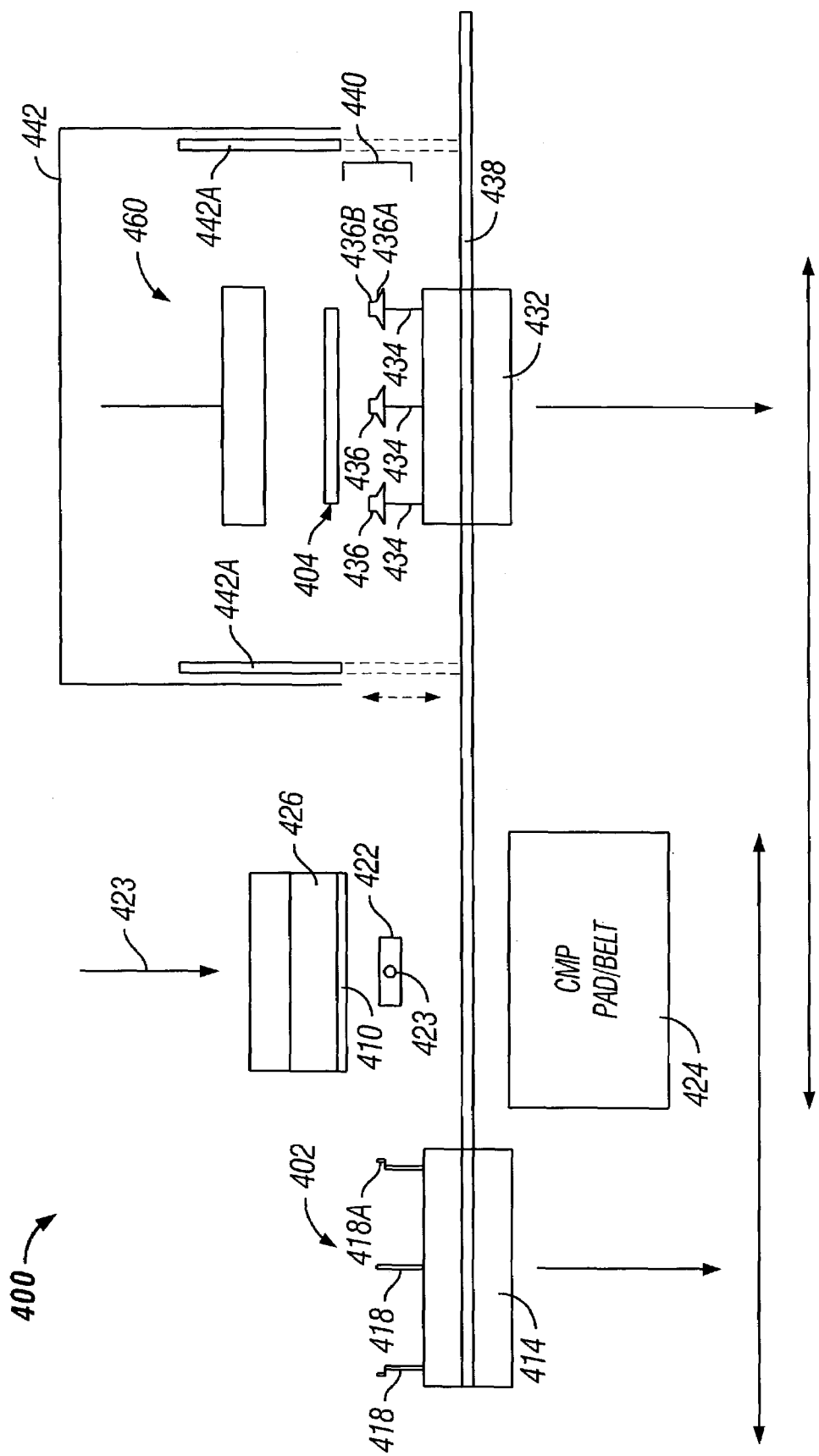
FIG. 4 is a schematic illustration of the chemical mechanical polishing processing station of the present invention.

The chemical mechanical polishing processing station 108D, described hereinafter, contains a wafer entry area 402 and a separate wafer exit area 404 as shown in FIG. 4. As will be described hereinafter, the chemical mechanical polishing processing station 108D is particularly suited for processing wafers that have had copper overburden deposited up to several thousand angstroms deposited that requires removal, with most of the removal typically being obtained using the chemical mechanical polishing processing station 108D. Wafers 110 are loaded into the wafer entry area 402 (see FIG. 4) of the chemical mechanical polishing processing station 108D using the second robot 116, and then removed from the chemical mechanical polishing processing station 108D at the wafer exit area 404 (see FIG. 4) using the first robot 114.

While the preferred sequence of operations is described above, it is noted that the system 100 is capable of moving the wafers 110 from each subsystem to another subsystem, in an order different from that recited above. Accordingly, usage of certain processing subsystems without others, as well as usage of processing subsystems in an order that is different than that recited above are within the scope of the present invention.

Figure 2:
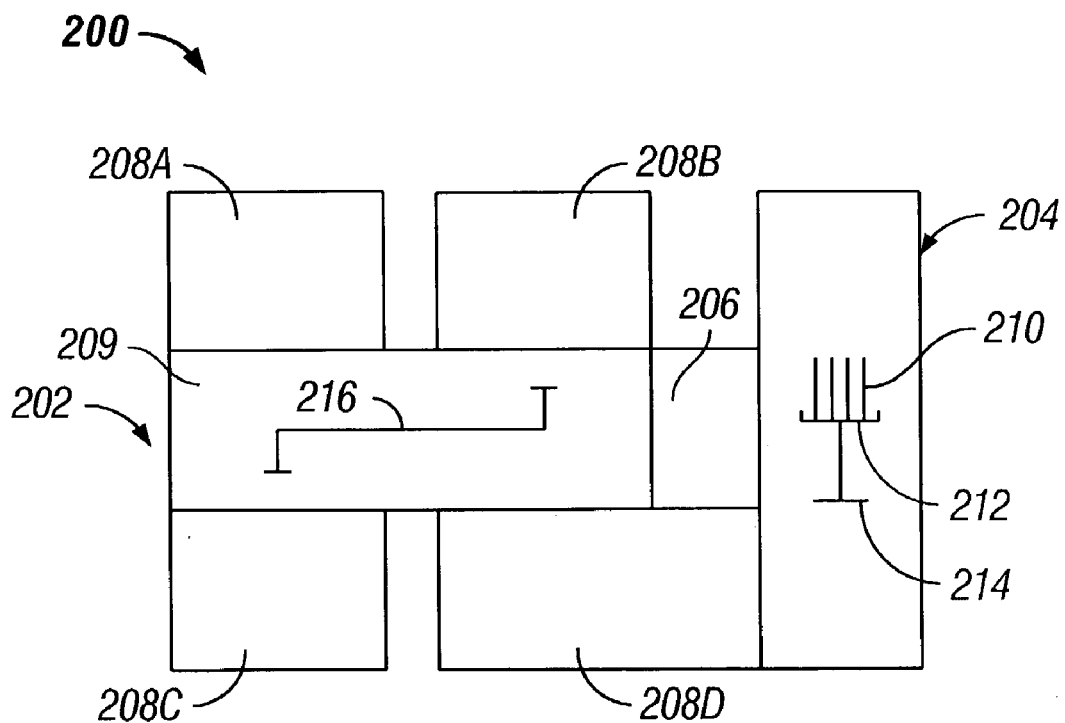
FIG. 2 is a schematic illustration of another system of the present invention including the chemical mechanical polishing process station of the present invention.

FIG. 2 illustrates another embodiment of an integrated tool 200 or system of the present invention. In this embodiment, the processing stations 208A–208C are populated with various types of deposition tools, such as the electrochemical mechanical processing station 208A and electrochemical processing station 208B and C. Each processing station 208A–208C is preferably configured as a vertical chamber as described above and further described in the U.S. Pat. No. 6,352,623, entitled "Vertically Configured Chamber Used for Multiple Processes", commonly owned by the assignee of the present invention. This allows variation between the type of processing that is used, and thus more flexibility in terms of the types of processing operations that can be performed.

The preferred sequence of operations is, nonetheless, the same as that discussed previously with respect to FIG. 1, in which one of the processing stations 208A–C is first used, and thereafter the chemical mechanical polishing processing station 208D is used. Thus, processing section 202, cassette 212 with cassette section 204, handling section 209, buffer section 206, first robot 214, and second robot 216 operate in the same manner as processing section 102, cassette 112 with cassette section 104, handling section 109, buffer section 106, first robot 114, and second robot 116 respectively described with reference to FIG. 1.

While the preferred sequence of operations is described above, it is noted that the system 200 is capable of moving the wafers 210 from each subsystem to another subsystem, in an order different from that recited above. Accordingly, usage of certain processing subsystems without others, as well as usage of processing subsystems in an order that is different than that recited above are within the scope of the present invention.

Figure 3:
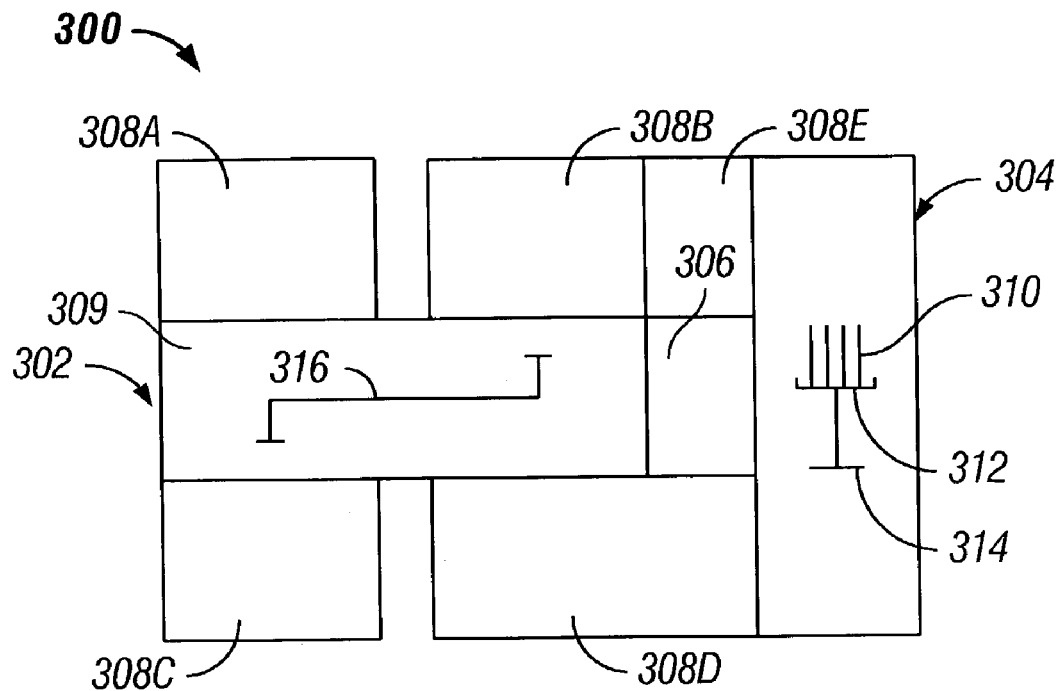
FIG. 3 is a schematic illustration of another system of the present invention including the chemical mechanical polishing process station and an anneal station of the present invention.

It is also within the scope of the present invention that the above systems may also comprise an anneal chamber to anneal the wafers. When an anneal chamber is included, it is preferable to have the anneal chamber located in proximity to the buffer area, and for the anneal chamber processing subsystem to include both a "hot" section capable of heating the wafer, and a "cool" section capable of cooling the wafer after annealing has been completed. Such an anneal chamber will typically have the ability to operate upon a single wafer at a time, and is well known. Thus, further description is not believed necessary. What is advantageous with respect to the present invention is the manner in which the anneal chamber is integrated with the other processing sections, in order to maximize efficiency and throughput. In particular, as shown in FIG. 3, both of the robots 314 and 316 can place wafers into or take wafers 310 out of the anneal chamber processing station 308E. If both robots can perform such operation, as described below, then if there are no further operations after annealing, the anneal chamber can act as a substitute buffer area.

In a preferred operation mode, however, a further chemical mechanical processing operation is performed after the anneal operation. In this operation mode, the integrated system 300 illustrated in FIG. 3 is advantageous for the following reasons.

As illustrated in FIG. 3, integrated tool 300 or system of the present invention using an anneal chamber processing station 308E as described above. The anneal chamber processing station 308E includes a processing section 302 and a load/unload section 304 connected to the wafer processing section 302, as will be described in further detail hereinafter. Separate from, but disposed vertically with respect to the anneal chamber processing station 308E, is a buffer section 306 that allows for movement of the wafer to and from the cassette 312 within cassette section 304, from and to the processing section 302 through the buffer section 306. As will also be described hereinafter, this allows for the system 300 to be configurable, either with an anneal chamber processing station 308E or without the anneal chamber processing station 308E.

The processing section 302 may comprise a first, second, third and fourth process stations 308A, 308B, 308C, and 308D in addition to the anneal chamber processing station 308E, which may be clustered around the handling section 309, as in the manner shown in FIG. 3. While the process stations 308A–308D can each perform a different type of process taken from the processes described above, in a preferred embodiment each of the process stations 308A–308C are the same type of process stations, such as an ECMPR process station, and the station 308D is comprised of a CMP processing subsystem that has an entry area 402 and an exit area 404 (see FIG. 4), as will be described further hereinafter.

In a preferred sequence of operations, wafers 310 or work pieces to be plated (with ECD and/or ECMD) are delivered to the cassette section 304 in a cassette 312 and then each may be transferred to the buffer section 306 by a first robot 314. Each wafer 310 may then be picked up and transferred to one of the vertical chamber stations 308A–308C by a second robot 316 so that plating and/or removal of conductive material from the front surface of the wafer and an initial cleaning is performed. Thereafter, the second robot 316 picks up the wafer 310 and transfers it to the annealing chamber processing station 308E. Once annealed and chilled within the annealing chamber processing station 308E, the wafer 310 can then be picked up by the second robot 316 and transported to the entry area 402 (see FIG. 4) of the CMP chamber processing station 308D. Once conductive material is removed from the front face of the wafer using the CMP chamber processing station 308D, which processing station 308D will also perform cleaning as described further herein, it is located in the wafer exit area 404 (see FIG. 4) so that the first robot 314 can directly pick up and transfer the wafer 310 to the cassette section 304.

While the preferred sequence of operations is described above, it is noted that the system 300 is capable of moving the wafers 310 from each subsystem to another subsystem, in an order different from that recited above. In particular, it may be useful to perform the chemical mechanical polishing operation prior to the annealing operation. Accordingly, usage of certain processing subsystems without others, as well as usage of processing subsystems in an order that is different than that recited above are within the scope of the present invention.

FIG. 4 illustrates an overview of the chemical mechanical polishing processing station 400, which is then used for processing station 108D illustrated in FIG. 1, 208D illustrated in FIG. 2, and 308D illustrated in FIG. 3. For purposes of FIGS. 4–7, the wafer being operated upon is designated wafer 410.

The chemical mechanical processing station 400 will be described in detail hereinafter. An initial overview of its operation is initially provided. As is apparent from FIG. 4, the chemical mechanical polishing processing station 400 includes a movable input housing 414 receives a wafer 410 from a second robot, such as robot 116 illustrated in FIG. 1, at a wafer input area 402. As shown in FIG. 4, the movable input housing 414 can then move the wafer 410 disposed thereon between the wafer input area 402 and a chemical mechanical processing apparatus 420 that chemically mechanically polishes the wafer 410. Another movable housing 432 moves the wafer 410 between the chemical mechanical processing apparatus 420 and cleaning and drying areas that are covered by cover 442, which cleaning and drying areas clean and dry the wafer, respectively. Within the cleaning and drying areas is also a wafer output area 404 (depicted as a box in FIG. 4) from which location the wafer 410 can be removed from the chemical mechanical polishing processing station 400 by a first robot, such as robot 114 illustrated in FIG. 1.

In the description that follows, the chemical mechanical polishing processing station 400 will be described with reference to a single wafer 410 that moves through the station 400. An advantage of the station 400 that will be apparent from this description is that more than one wafer 410 can be located within the station 400 at a time. In particular, at any given time, up to three wafers can be located within the system. With three wafers, one wafer is disposed on the movable input housing 414, waiting to place its wafer on the chemical mechanical processing apparatus 420, a second wafer is operated on by the chemical mechanical processing apparatus 420, and a third wafer is operated upon within the cleaning and drying areas. This configuration thus improves throughput, as chemical mechanical polishing can take place on one wafer and cleaning and drying can take place on another wafer at the same time.

The chemical mechanical polishing processing station 400 will now be described in more detail. The wafer entry area 402 mentioned previously includes a plurality of at least three holding pins 418 mounted on a movable housing 414. The pins 418 are each configured so that the wafer 410 will rest on a portion of each pin 418, with all of the pins 418 thus supporting the wafer on the movable housing 414. With the wafer 410 being supported by the pins 418, the movable housing 414 can be moved along a track 438 between the wafer entry area 402 and the chemical mechanical polishing processing apparatus 420. Movement of the movable housing 414 preferably uses a cylinder (not shown) that is operated under electronic control 490 (shown in FIG. 5), which electronic control is preferably computer based and operates using application software written to control the movement of the various components described herein.

A robot, such as robot 116 in FIG. 1, will place the wafer 410 in the wafer entry area 402 so that the wafer holding pins 418 can hold it as described above. Once so held, the movable housing 414 moves the wafer 410 to the chemical mechanical polishing processing apparatus 420. Once within the chemical mechanical polishing apparatus 420, the wafer 410 is preferably centered using a centering apparatus 422. As illustrated in FIG. 4, the centering apparatus includes a rod 423 that is mechanically moved, such as by a piston, and laterally pushes the wafer so that it is properly positioned using the top edge 418A of two of the pins 418 and the end of the rod 423. This ensures that the wafer 410 is in proper position for the carrier head 426 to then pick up the wafer 410. When the carrier head 426 picks up the wafer 410, the front surface of the wafer 410 is disposed in a down position and movement of the carrier head 426 will allow the front surface to contact the pad or belt 424 associated with the chemical mechanical polishing process. Chemical mechanical polish processing, using either an abrasive pad or belt 424, or a slurry or both can take place in a conventional manner in the chemical mechanical polish processing apparatus 420, preferably with the carrier head rotating and the chemical mechanical polishing apparatus 420 having a polishing pad that either rotates or, most preferably, moves bi-linearly. With the most preferred bi-linear movement of the chemical mechanical polishing apparatus 420, the chemical mechanical processing system uses a chemical mechanical polishing apparatus 420 as described in U.S. Pat. No. 6,468,139, assigned to the same assignee as the present invention.

Once chemical mechanical polishing in the chemical mechanical polish processing apparatus 420 is complete, another movable housing 432, to which supports 434 that hold wafer holding spools 436 are attached, is moved underneath the chemical mechanical polish processing apparatus 420, with the movable housing 414 being moved to the wafer entry area 402, awaiting receipt of another wafer. The wafer 410 is unloaded from the carrier head 426 onto the wafer holding spools 436. The holding spools 436 are preferably round from a top view, made of a hard rigid material that does not interact with the wafer and cleaning solutions, and have a lower lip 436A that is longer than an upper lip 436B. This construction allows for the release of the wafer 410 onto the lower lip 436B when the spools 436 are in an open position. Once the wafer 410 has been removed from the carrier head 426 onto the lower lip 436A of the spools 436, the spools 436 are then positioned into a closed position using a motor not shown that is controlled by the electronic control 490 illustrated in FIG. 5. With the spools 436 in the closed position, the wafer 410 is tightly held at its edges between the lower lips 436A and the upper lip 436B. With the wafer 410 in place, the movable housing 432 transports the wafer 410 to cleaning and drying areas that are within an area covered by cover 442.

Once the wafer 410 is within the cleaning area 440, a portion 442A of cover 442 is lowered to cover the wafer 410 and the movable housing 432 so that cleaning and drying processes can take place. As will be described hereinafter, the cleaning process takes place while the wafer is still attached to the movable housing 432, and, once cleaning occurs, a rotatable wafer transport device 460 will pick the wafer 410 off the movable housing 432 and rotate it for drying. Once the wafer 410 is dry, it will be held by the rotatable wafer transport device 460 in the exit area 404 mentioned previously, the cover portion 442A will be raised, and then another robot, such as either robot 114 or robot 116 depending upon the system configuration used, will pick up the wafer 410 from its held position on the rotatable wafer transport device 460 and transport the wafer 410 to the next location.

Figure 5:
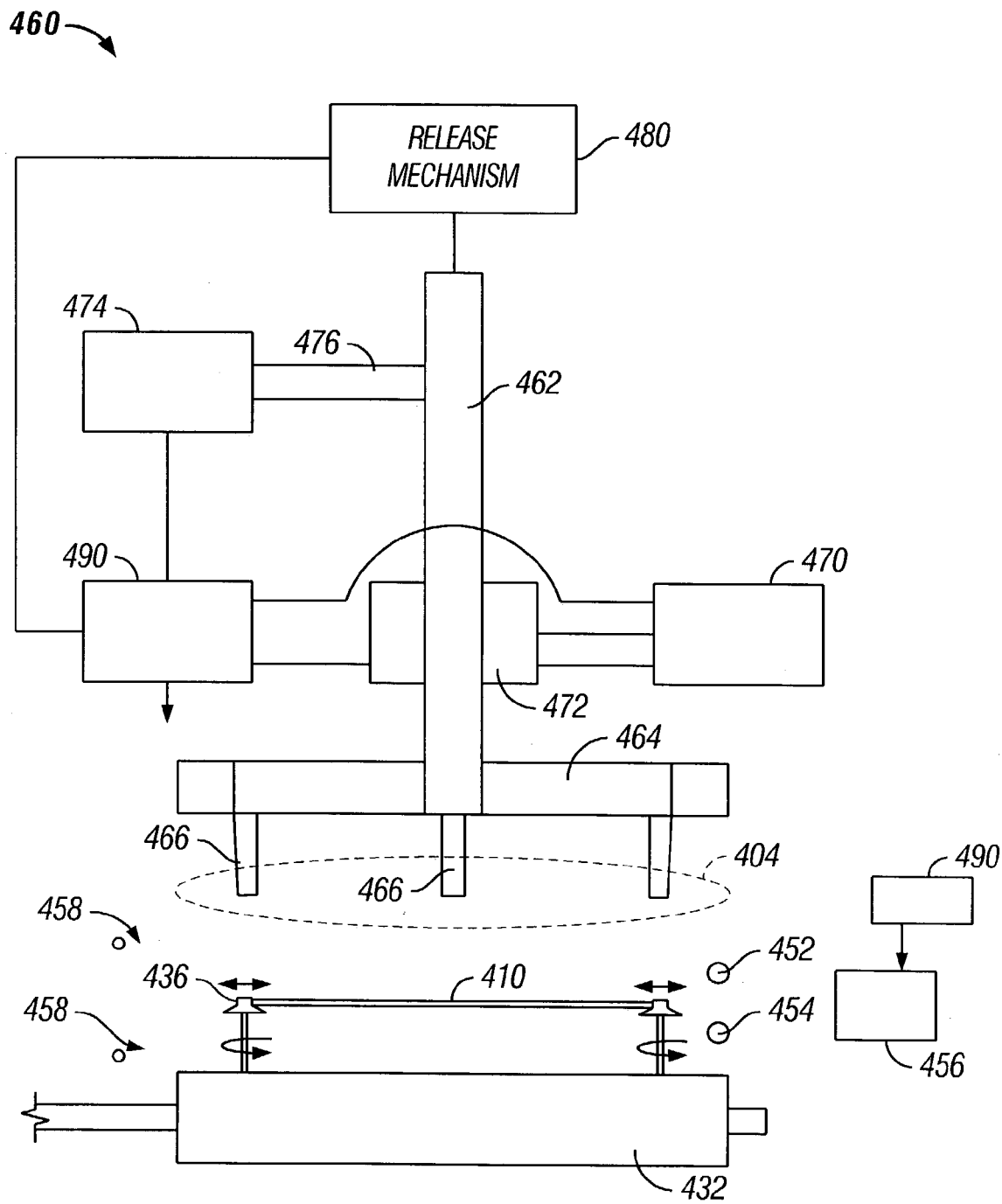
FIG. 5 is a schematic illustration of a cleaning drying module of the present invention including the cleaning and drying mechanisms according to one embodiment of the present invention.

FIG. 5 illustrates in further detail the components that are located within the cleaning and drying area 440. As illustrated, two cleaning rolls 452 and 454 are disposed on the front and back surfaces of the wafer 410, respectively, are moved over a portion the wafer 410 such that the entire radius of the wafer 410 is covered. The rolls 452 and 454 are then rotationally driven, shown by a motor 456 and, controlled by electronic control 490, although other drive and control mechanisms could be used. With the rolls 452 and 454 spinning, the spools 436 are rotated using a motor, not shown, disposed within the movable housing 432 and controlled by electronic control 490. Rotation of the spools 436, each in the same rotational direction, cause rotation of the wafer 410, so that each part of the front and back surfaces of the wafer 410 contact one of the rolls 452 and 454 at some point in time during the cleaning process. During cleaning, as is known, a cleanser is typically applied onto the wafer and the cleaning rolls remove residue left from the chemical mechanical polishing process, and then a DI water rinse is performed using spray jets 458. As noted above, the rolls 452 and 454 and the spray jets 458 will operate upon the wafer 410 while it is still maintained between the holding spools 436 on the movable housing 432.

Once the wafer has been cleaned, it must be dried. For drying, the rotatable wafer transport device 460 is used to pick the wafer 410 off the holding spools 436, raise the wafer to a rotation position, and rotate the wafer to dry it. The components that make up the rotatable wafer transport device 460 include rotatable shaft 462 that is rotated using a motor 470 and drive components 472, and which is moved up and down using up/down cylinder 474 connected through up/down drive components 476, all of which are controlled through electronic control 490. Attached to the rotatable shaft 462 is a wafer carrier 464 that contains clamps 466, the operation of which will be described further hereinafter in conjunction with the release mechanism 480 that is also operated through electronic control 490.

Figure 6:
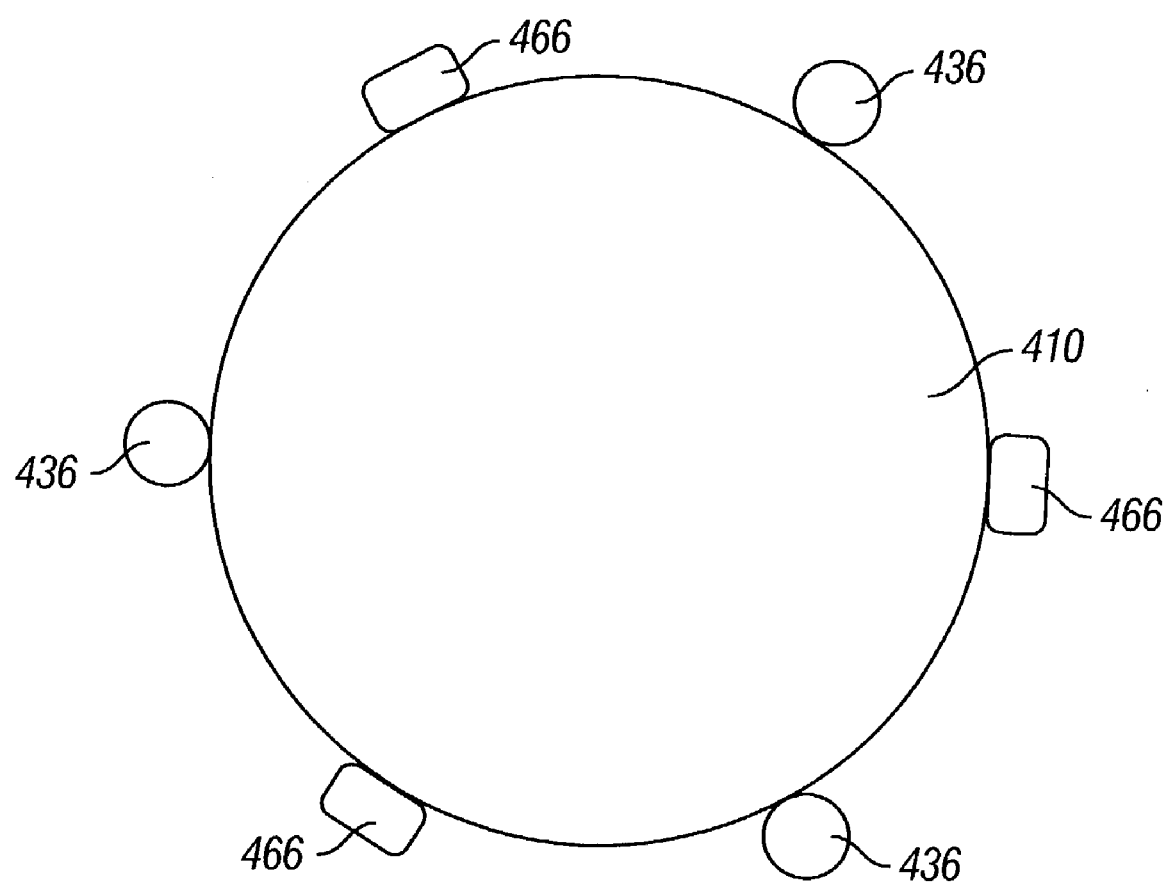
FIG. 6 is a schematic illustration of a wafer indicating the relative positions of the holding spools and the dryer clamps.
Figure 7:
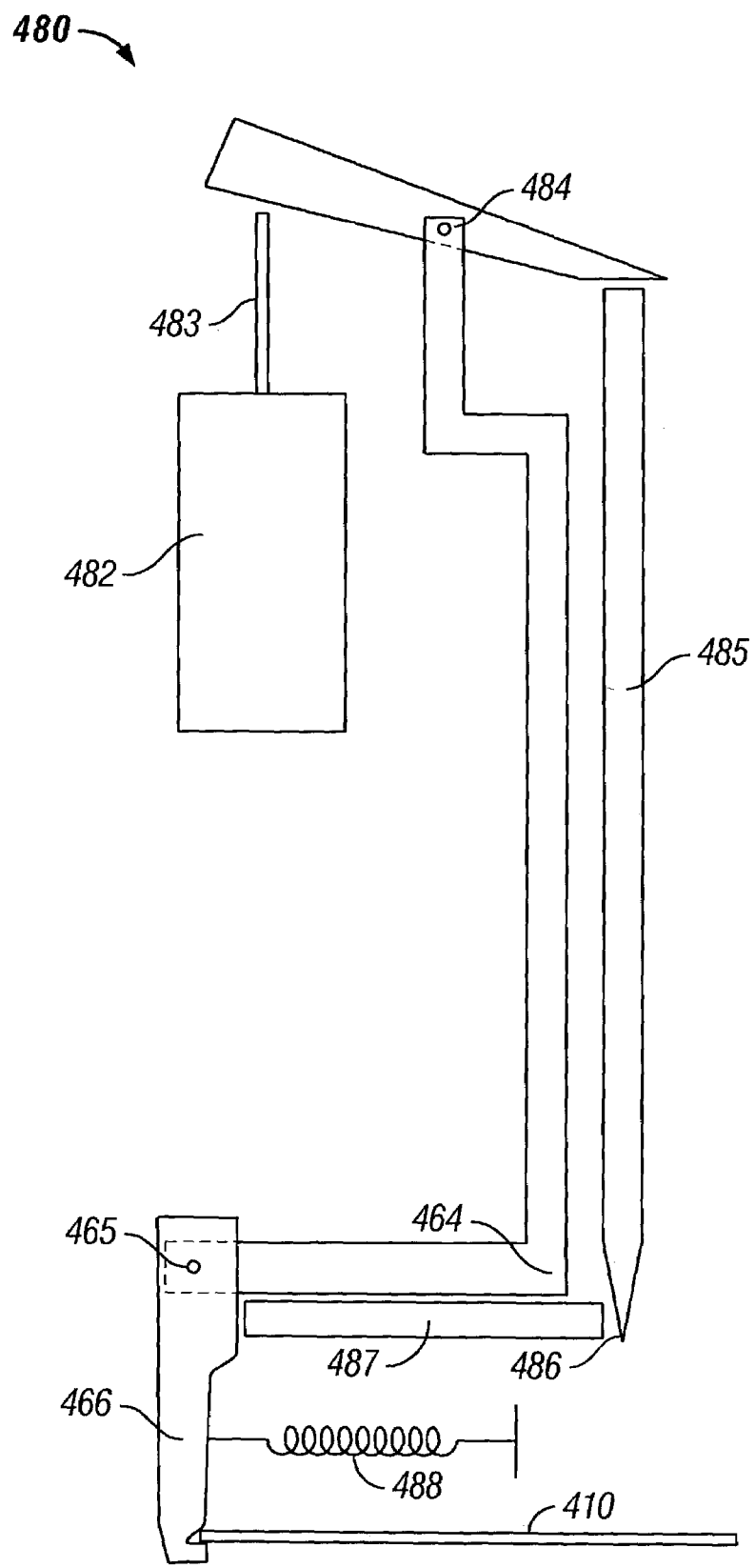
FIG. 7 is a schematic illustration of an embodiment of a wafer release and hold mechanism of the dryer.

FIG. 6 illustrates a top view of the wafer 410 when it is positioned between the holding spools 436, and the orientation of clamps 466 with respect to the holding spools 436 so that provision can be made to ensure that the wafer 410 is not dropped. In the transfer of the wafer 410, the holding spools 436 are retained in the closed position to ensure their hold on the wafer 410 until the clamps 466 also have that hold, at which time the spools 436 are moved to the open position, and the wafer 410 can move up, past the upper lips 436B of the spools which are no longer holding the wafer 410. FIG. 7 further illustrates the release mechanism 480, that is used to control the position of clamps 466, so that at certain times the clamps are in a position that holds the wafer 410, and at other times are in an outward position so that they do not interfere with the wafer 410, as will now be described.

In the initial position after the wafer 410 has been cleaned as described above, the wafer carrier 464 is disposed above the wafer 410 so that the clamps 466 do not interfere with the cleaning operation. The rotatable wafer transport device 460 must then be moved into a position to pick up the wafer 410. When this movement occurs, the clamps 466 must be disposed in an open position. This open position is ensured by using the release mechanism 480, which, through electronic control will cause activation of the rod 483 associated with the release cylinder 482, and cause downward movement of release lever 484, and thus movement of release bar 485. The downward movement of release bar 485 will cause the angled edge area 486 of the release bar 485 to move each horizontal release member 487, associated with each clamp 466, and thus cause each clamp 466 to pivot outwardly around pivot point 465. This open position of clamps 466 is maintained even during a power outage since the release cylinder 482 is locked into with the rod 483 in the outward position, which requires another active signal from the electronic control 490 to release the rod 483 that will thus allow the clamps 466 to close.

Once the clamps 466 are in the correct position for holding the wafer 410, but still in an open position, the active signal is applied, and the clamps automatically close, since the spring force from the springs 488 will cause retraction of the horizontal release members 487, which in turn will cause the upward movement of release bar 485.

With the clamps 466 in a closed position, the entire wafer carrier 464, along with the release mechanism 480, is moved to a spin position, where the wafer carrier 464, and thus the wafer 410, is rotated for drying.

Thereafter, the wafer carrier 464 is moved so that the wafer 410 is in the exit position 404, and the wafer can be removed from the clamps 466 onto another robot. It is noted that if a power outage occurs when the clamps 466 hold the wafer 410, that the bias from the springs 488 will still retain the wafer 410 and it will not drop.

As shown in FIGS. 1–3, in these embodiments the wafer exit position 404 is such that the first robot within the cassette section will pick up the wafer. This reduces the number of transport tasks required of the second robot within the handling area of the processing section.

While the first robot within the cassette section can be used to pick up the wafer from the wafer exit position, that is not necessary for all configurations. Rather, in certain configurations, the second robot can also pick up the wafer from the wafer exit position.

Figure 8:
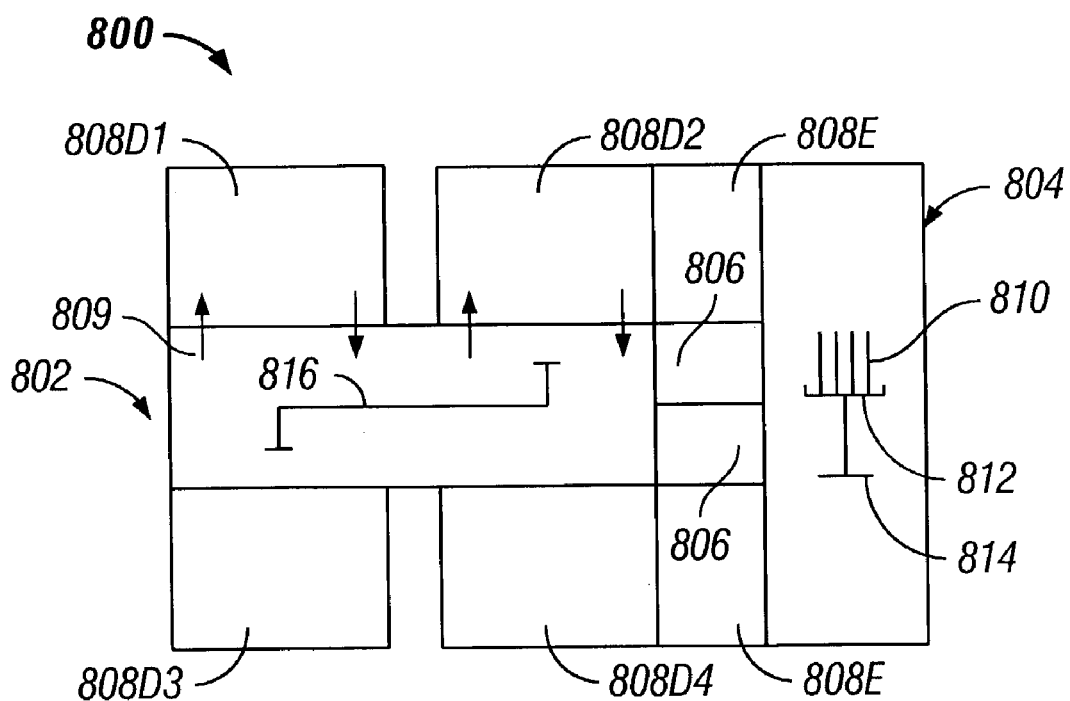
FIG. 8 is a schematic illustration of another system of the present invention having a plurality of chemical mechanical polishing stations and anneal stations.

One embodiment in which the second robot picks up the wafer from the wafer exit position is illustrated in FIG. 8, which embodiment shows a plurality of chemical mechanical polishing stations 808D, made as described above, and which are used either with or without an anneal processing station 808E. In this embodiment, the robot 816 in the wafer handling area 809 moves the wafers from the buffer 806 into either the anneal processing station 808E or one of the chemical mechanical polishing stations 808D. The first robot 814 disposed within the cassette section 804 will move the wafers from their cassette to the buffer 806.

In each of the above embodiments, it is noted that it is desirable for the first robot within the cassette section to pick up the wafer with the front side up, and place the wafer with the front side down on the buffer. Thereafter, the robot within the wafer handling area of the processing section, and each of the processing subsystems, will operate on the wafer with the front side down. While this is not required, it reduces complexity and minimizes movements of the wafer that could cause dropping of the wafer.

Figure 9:
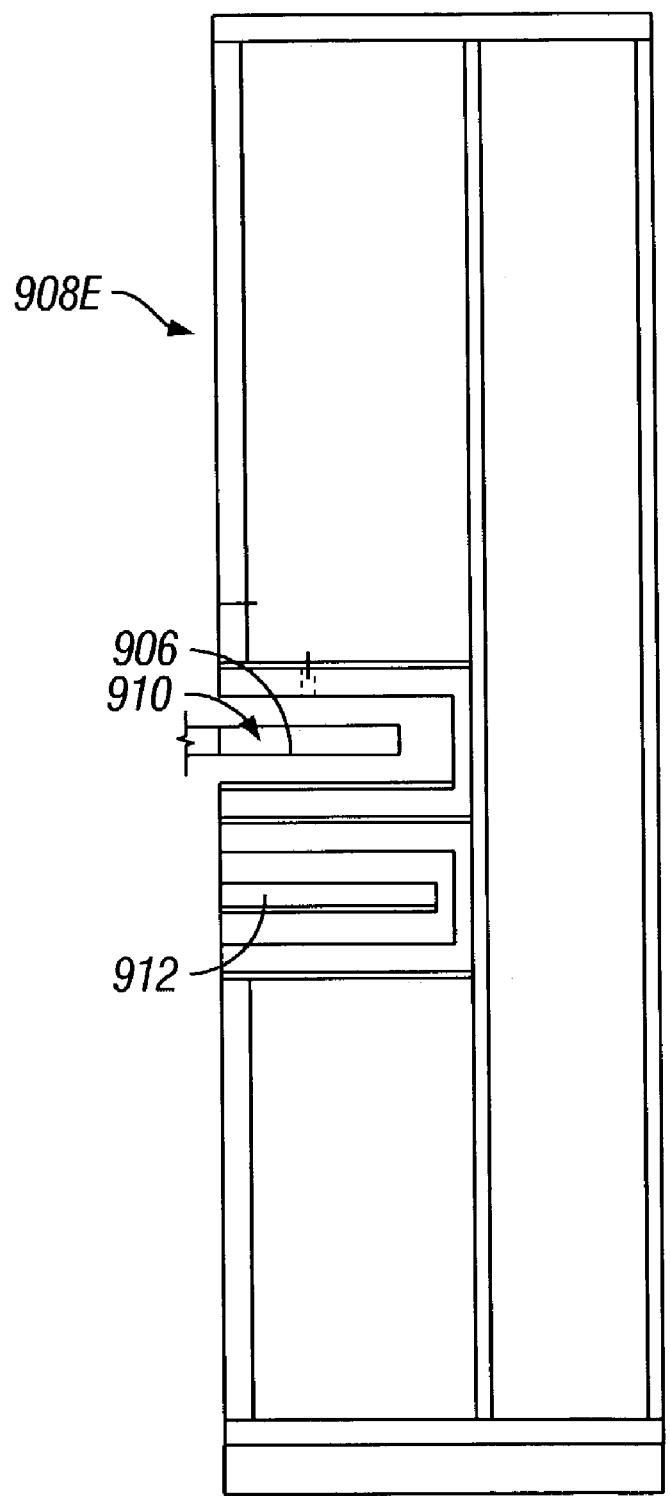
FIG. 9 is a schematic illustration of the anneal station of the present invention wherein the station has an anneal slot and an buffer slot to be used as a buffer zone.

FIG. 9 illustrates a view of the anneal chamber processing station 908E in further detail. As illustrated, the anneal chamber processing station 908E contains an open area 910 which allows the anneal chamber processing station 908E to be added to an existing system, with the open area 910 corresponding to the position of the buffer 906. Thus, the buffer 906 is disposed above or below (above as shown) the wafer entry/exit area 912 of the anneal chamber processing station 908E.

In the various embodiments mentioned above, it has been noted that the present invention is capable of operating upon different sized wafers, which wafers are placed into a cassette section. The size of the wafer in each of the different cassette is known through, for example, a software tag that is used by a system controller. Further, the robot arms that lift the wafers are configured so that they can detect the center of each wafer, regardless of size, and properly pick the wafer up.

In addition, for each wafer, the system controller is also loaded with the process sequence, or recipe, that is needed for that wafer, with various portions of the process sequence performed by different processing stations. When sending a particular wafer to a particular processing station, that portion of the recipe can be sent in a command by the system controller to a processing station module, and that process can then take place, which then also allows tracking of the wafers that are being routed.

While in a production environment it is typical for each wafer to have the same process sequence, and that is contemplated by the present invention as well, in certain research settings, have more control over the processing of each wafer has been found beneficial. Thus, as each wafer is transported to the appropriate processing station, which can include processing stations of the same type which operate upon different sized wafers, the system controller will track of the progress of the wafer through the system, so that coordination of the transport of the wafer from processing station to processing station can occur.

Each of the various subsystems that are referred to herein preferably contain electronic control, such as the electronic control 490 described with respect to the chemical mechanical polishing apparatus 400, that allow each of the various subsystems to operate in the integrated system and independently. During operation with the integrated system, the electronic control of each particular subsystem will work with the system controller to ensure that operations with other subsystems and the wafer handling system are synchronized with the overall system operation. During operation of each subsystem independently, the electronic control of the particular subsystem is capable of controlling the operations performed by that particular subsystem. Accordingly, since subsystems can be used together and independently, the same subsystems can be used in a greater variety of configurations, thus increasing their flexibility.

FIGS. 10–16 illustrates a chemical treatment/cleaning/rinsing-drying module in accordance with another embodiment of the present invention. The module of the present invention is able to perform chemical treatment, apply mechanical and megasonic cleaning means as well as rinse and dry processes in the same module. In general, the chemical treatment/cleaning/rinsing-drying module includes chemical treatment/cleaning/rinse devices and drying devices placed in an enclosure, and a movable housing. Chemical treatment/cleaning/rinse devices may be roller brushes and various nozzles to spray DI water or the chemical treatment solutions on the workpiece as well as megasonic nozzles. Drying devices may be a spinner to spin dry the workpiece. The enclosure of the module has an opening to allow the movable housing in and out of the module.

The movable housing includes a support structure which includes holders to hold a workpiece on the movable housing. The holders may be comprised of support members and holding spools placed on top of the support members. One of the holding spools can also be used as a driving spool that rotates the workpiece as the workpiece is held by the spools during the cleaning process. In this embodiment, the movable housing may include a door, which closes and seals the opening of the module when the housing is inside the module. However, other mechanisms, which may seal the opening of the module, may be used and is within the scope of this invention. Once the movable housing is inside the module, the driving spool also engages a gear connected to a drive motor and rotates. This, in turn, rotates the workpiece on the movable housing during the cleaning done by the chemical treatment/cleaning/rinse devices and drying device. Once the workpiece is cleaned, the drying assembly picks up the workpiece and spin dries it. Although any other means of drying can also be used to dry the workpiece. After the spin drying process, the workpiece is transferred out of the module using a robotic arm.

Figure 10:
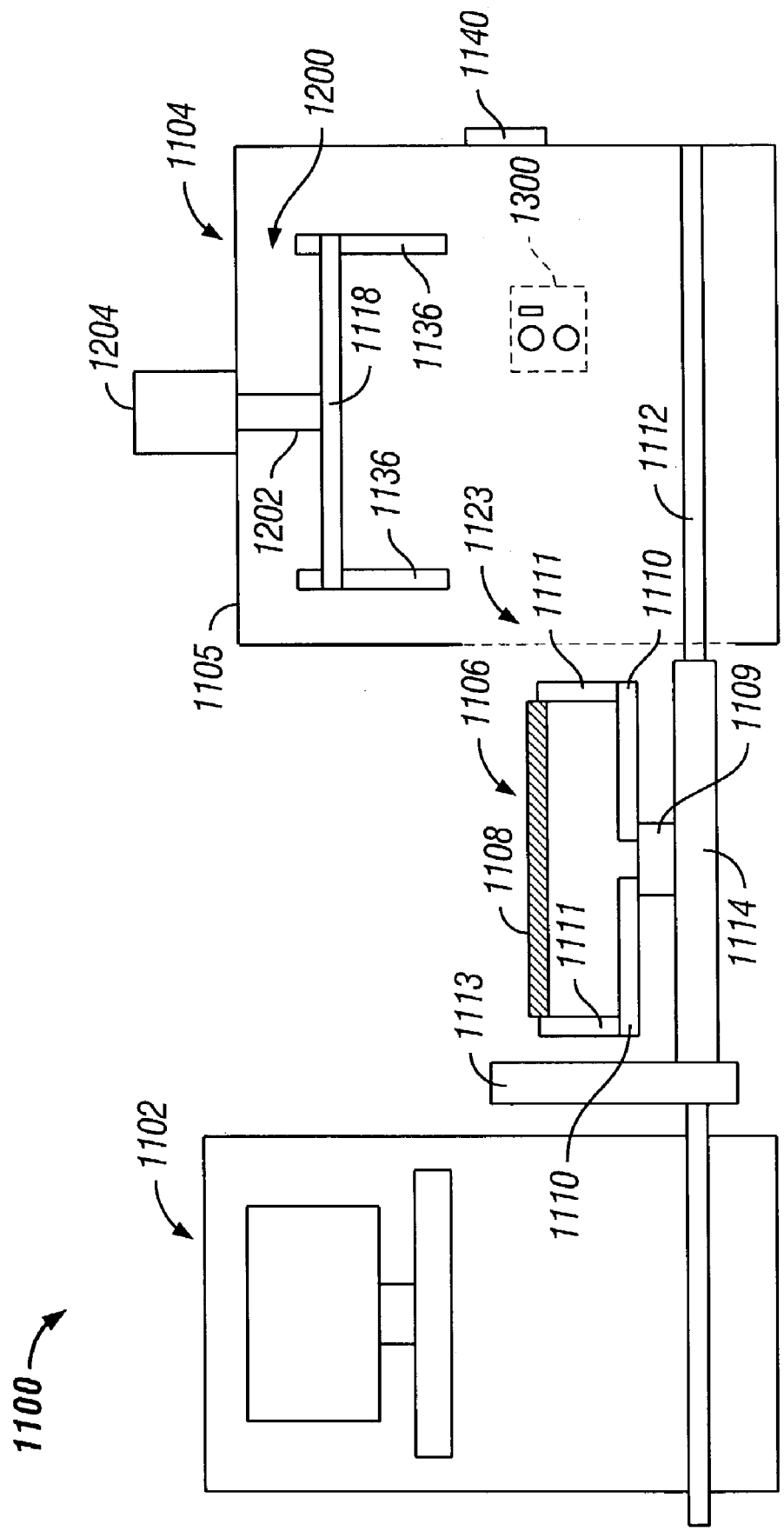
FIG. 10 is a schematic illustration of another embodiment of the integrated chemical mechanical polishing processing station.
Figure 17:
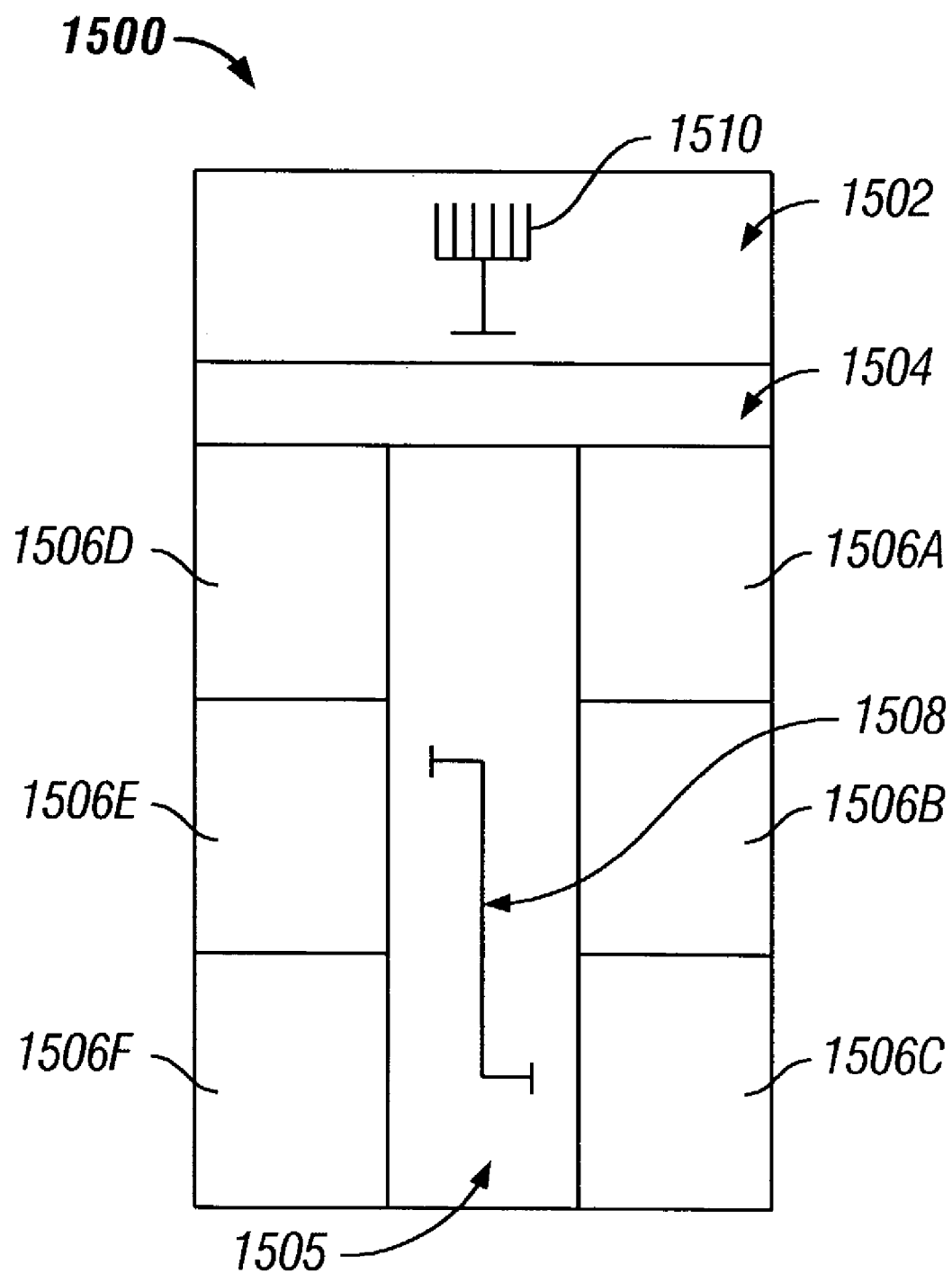
FIG. 17 is a schematic illustration of a system of the present invention including a plurality of the chemical treatment/cleaning/rinsing-drying modules.

FIG. 10 illustrates a simplified side view of a cluster tool 1100 including an embodiment of a chemical treatment/cleaning/rinsing-drying module 1104 in accordance with the present invention. In this embodiment, the cluster tool 1100 may include a plating or polishing module 1102, the chemical treatment/cleaning/rinsing-drying module 1104, and a movable housing 1106. The tool 1100 may be used in any of the systems described above in connection with FIGS. 1, 2, 3 and 8. The chemical treatment/cleaning/rinsing-drying module 1104 will be referred to as module hereinafter. It is understood that the module 1104 may be used as an integral part of the tool 1100 or as an individual stand-alone chemical treatment/cleaning/rinsing-drying module. If the individual version of the module is preferred the wafers may be fed and removed manually or by a robot. As shown in FIG. 17, a plurality of modules may be placed in a system.

Although in the preferred embodiment the plating or polishing module 1102 is a CMP module, it can be any process module used in the overall workpiece manufacturing process such as ECMD, ECME or ECD. It is understood that the cluster tool shown in FIG. 10 is similar to the CMP processing station 400 shown in FIG. 4. Similar to the previous embodiment, a movable input housing (not shown) receives a wafer from a robot 116, such as the second robot shown in FIG. 1. The movable input housing (not shown) then moves the wafer to the CMP module 1102. A workpiece 1108 can be transferred from any module (i.e., the plating or polishing module 1102) to the module 1104 using the movable housing 1106.

The movable housing 1106 includes a center portion 1109 which is connected to a base 1114. Support members, namely horizontal support members 1110 and vertical support members 1111, are connected to the center portion 1109 by the horizontal support members 1110. As will be described more fully below the workpiece 1108 is held over the vertical support members 1111. The movable housing 1106 includes the base 1114 for moving the housing 1106 along tracks 1112. A door 1113 is connected to the base 1114 and can be considered part of the housing 1106. The housing 1106 can be moved along the tracks 1112 using any known method.

In conjunction with the movable housing 1106, the module 1104 is comprised of an enclosure 1105, a drying assembly 1200 and chemical treatment/cleaning/rinse assembly 1300 such as brushes, cleaning solution nozzles, megasonic cleaner nozzles and their associated components.

The enclosure 1105 of the module 1104 includes an open end 1123 along the side wall of the enclosure. The open end 1123 is known as the entry and exit area for the movable housing 1106. When the housing 1106 is in the module 1104, the entry and exit area 1123 of the housing 1106 is sealed by the door 1113 when the movable housing 1106 is in the module 1104.

The drying assembly 1200 is comprised of a rotatable wafer transport device 1202 or a spinner and a spinner moving assembly 1204. The spinner 1202 of the module 1104 is comprised of a rotating shaft 1190 and a spinning wheel 1118 that is attached to the lower end of the shaft 1190. As will be described more fully below, the spinner 1202 is rotated by the moving assembly 1204. Clamps 1136 for holding the workpiece 1108 are attached to the spinning wheel 1118 at its outer circumference. When the cleaning and spin drying processes are completed, the workpiece 1108 is transferred out of the module 1104 through the workpiece exit area 1140. The workpiece 1108 may be transferred out of the module 1104 using a robotic arm with a blade and vacuum. The workpiece 1108 can also be transferred out using any other known transfer apparatus and method.

Figure 11:
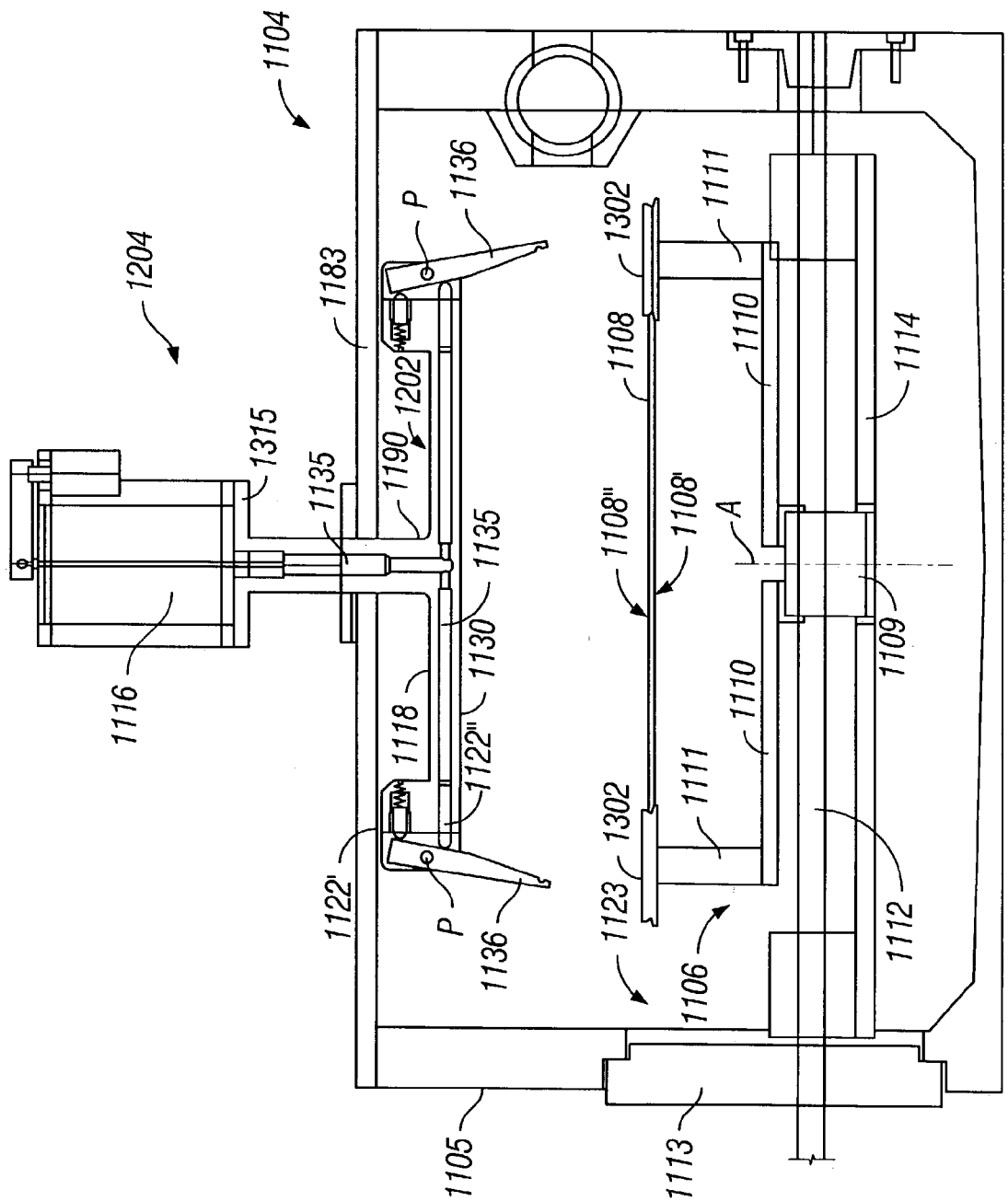
FIG. 11 is a schematic illustration of a chemical treatment/cleaning/rinsing-drying module of the of the integrated chemical mechanical polishing processing station of the present invention.
Figure 12:
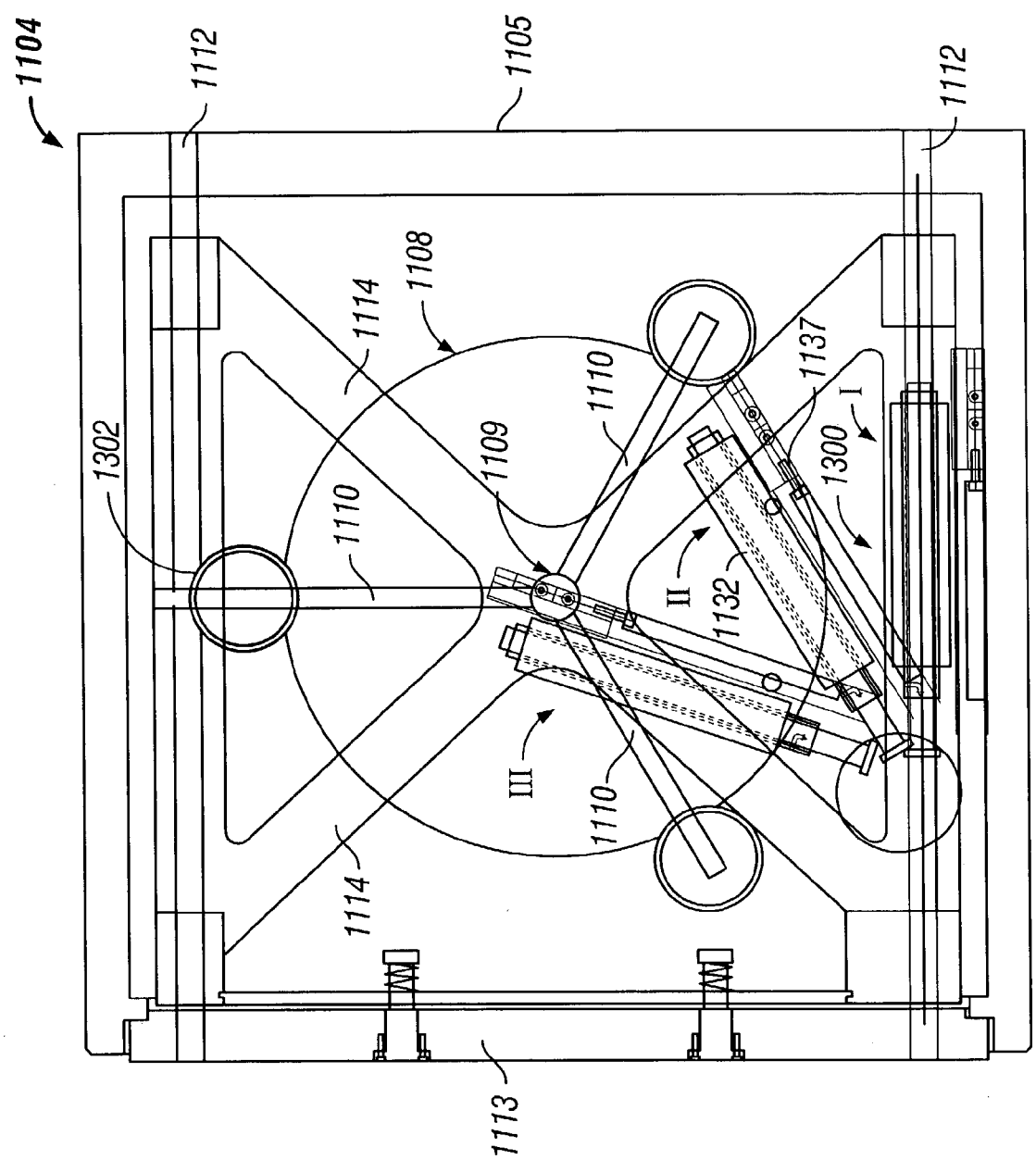
FIG. 12 is a schematic plan view of the chemical treatment/cleaning/rinsing-drying module of the present invention.

FIG. 11 illustrates a side view of the module when the movable housing 1106 is moved inside module 1104. The movable housing 1106 holds wafer 1108 to be cleaned and spin dried while the entrance 1123 of the module is sealed by the door 1113 of the housing. In FIG. 11, the spinner is in fully retracted position to allow cleaning of the workpiece. As previously explained, in the previous embodiment, the housing retains the work piece such as a wafer upside down so that a front side 1108' of the wafer 1108 faces down while a back side 1108" of the wafer faces up. The front side of the wafer may be preprocessed using CMP. FIG. 12 shows movable housing, in plan view, inside the module 1104. Referring to FIGS. 11 and 12, center portion 1109 of the movable housing is secured to the base 1114 in the center of the movable housing 1106. The housing is moved using the rails 1112 engaged both sides of the base 1114. Three of the horizontal support members 1110 extend between the center portion and the vertical support members 1111 and radially uniformly disposed around the center portion 1109. The angle between two horizontal support members is preferably 120 degrees. In this embodiment, the housing has three horizontal and three vertical support members. The vertical support members 1111 are attached to the outer ends of the horizontal support members, and extend vertically and parallel to the vertical axis 'A' of the center portion 1109. Referring to FIG. 11, the upper ends of the vertical supports 1111 further include spools or holding spools 1302 that are used to secure the workpiece 1108 during the cleaning process. Holding spools are previously described above and in connection with FIGS. 4–5. The radial position of the vertical supports 1111 can be arranged to accommodate workpieces of different sizes (i.e., 200 mm, 300 mm, etc.).

FIG. 11 also shows part of the spinner moving assembly 1204 and the spinner 1202. The spinner 1202 is attached to and is rotated by a spinner drive motor 1116 of the moving assembly 1204 that is located on the ceiling 1183 of the enclosure 1105. The drive motor 1116 is installed on a platform 1315 that is further attached to an air cylinder 1314 (see FIG. 15). The air cylinder 1314 shown in FIG. 15 moves the drive motor 1116 and the spinner vertically up and down by the air pressure. The drive motor 1116 is attached to an upper end of the shaft 1190 of the spinner.

Clamps 1136 of the spinning wheel hold the workpiece 1108 during the drying process. Clamps 1136 are movably attached to the ends of arms 1130 and are pneumatically controlled to pick up, hold and release the workpiece before, during and after the spin-drying process. The spinning wheel includes three arms 1130. Airlines 1135 from an air supply (not shown) runs through the shaft and then distributed into the arms 1130 of the spinning wheel 1118. The clamps 1136 are moved into open and closed positions by the pushers 1122', 1122" which are movably located at the ends of the arms. The pushers 1122' are spring loaded and bias and keep the clamps in closed position. The pushers 1122" are located at the end of the airlines 1135 in each arm 1130. In order to open the clamps, pressurized air from the air lines 1135 is used to move air activated pushers 1122' towards the clamps and thus cause each clamp to pivot outwardly around pivot point P. When the air pressure is released, the pusher 1122' causes clamps to pivot inwardly around the pivot point 'P' and thereby closing them. The spinner and its components can be controlled by an electronic control system similar to the one described in the previous embodiment.

Figure 13:
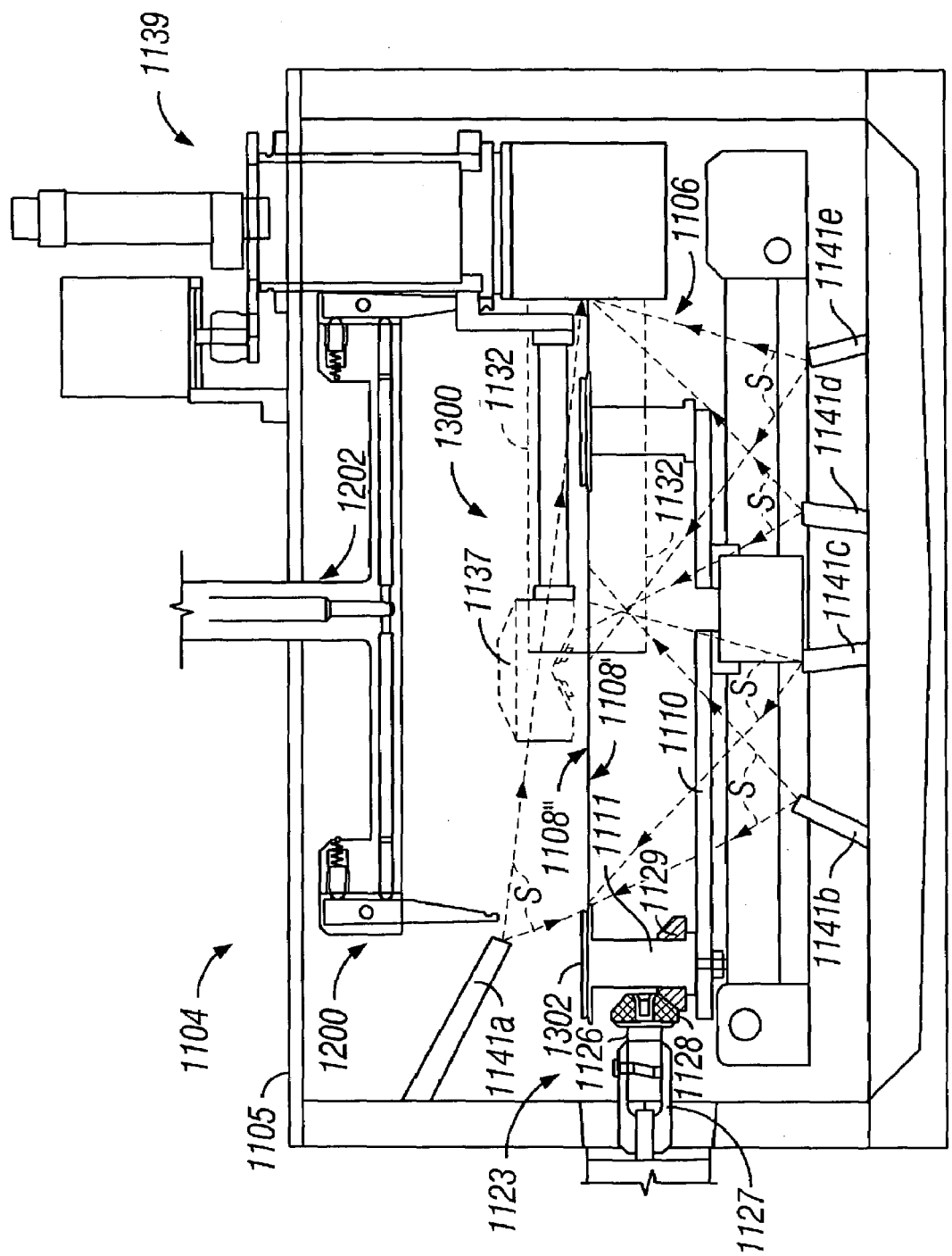
FIG. 13 is a schematic illustration of a chemical treatment/cleaning/rinsing-drying module of the of the present invention wherein a wafer is cleaned by a cleaning mechanism of the module.

FIG. 13 shows a side view of the module 1104 with the chemical treatment/cleaning/rinse assembly 1300 including mechanical cleaners, such as a pair of rollers brushes 1132 and megasonic nozzle 1137 and spray nozzles 1141a–1141e. Nozzles are placed on the side walls or floor of the enclosure 1105 of the module. In this embodiment, nozzle 1141a spray a solution depicted by S to the back side of the workpiece 1108 while the nozzles 1141b-1141e are able to spray the solution S to the front side of the workpiece while the workpiece is rotated on the movable housing 1106. In this embodiment, solution depicted by S may be a chemical solution to chemically treat the workpiece or DI water to rinse the workpiece.

Referring to FIG. 12 and FIG. 13 brushes 1132 and megasonic nozzle 1137 are shown in home position I and cleaning positions II and III. The roller brushes clean the front and back sides 1108', 1108" of the rotating wafer 1108 while rotating and performing a sweeping action between the positions II and III. Various mechanical actions of the brushes and the megasonic nozzle are controlled by a drive unit 1139. As will be described below, the workpiece is rotated on the movable housing 1106 using a workpiece rotating mechanism. Megasonic nozzle is next to the brush 1132 that works on the back side 1108" of the workpiece. Megasonic nozzle 1137 generates megasonic waves during the cleaning process. In particular, megasonic waves dislodge the particulates that are hard to remove using brushes. In this respect, the megasonic nozzle may be used with the brushes at the same time or by itself before the brush cleaning or again by itself after the brush cleaning.

FIG. 13 also illustrates a workpiece rotating mechanism 1123 in accordance with the present invention. The workpiece 1108 can be rotated using one of the vertical supports, which will be referred to as drive support. The drive support includes a support gear. As previously mentioned, one of the vertical support s 1111 is furnished with a drive member that enables it to rotate. As this particular support rotates, it also rotates the spool 1302 on top of it. Rotation of the spool 1302 in turn rotates the wafer that is held by the spools. The support is rotated by a drive gear 1128 of the workpiece rotating mechanism 1123 when support gear 1129 of the drive support engages the drive gear 1128 of the workpiece rotating mechanism 1123. The drive gear 1128 is attached to a plunger that is movable placed in a sleeve 1127 which allows the plunger to move back and forth and rotate in the sleeve. When plunger is rotated by a drive motor (not shown) attached on a side wall, the drive gear 1128 rotates and also rotates the drive support.

Figure 14A:
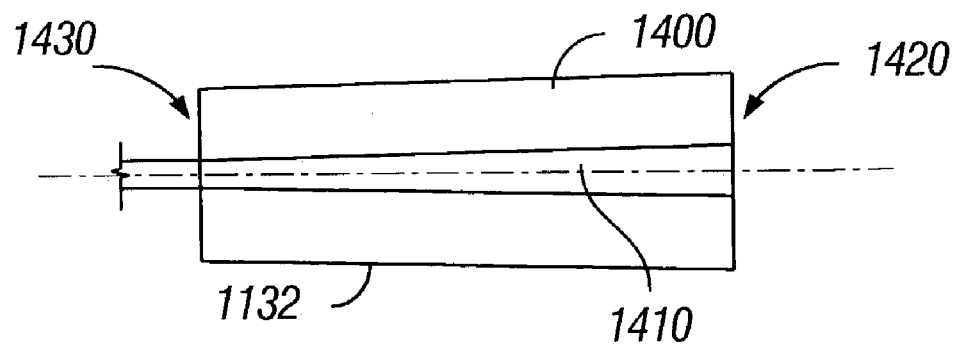
FIGS. 14A–14B are schematic illustrations of the roller brushes used in the module.
Figure 14B:
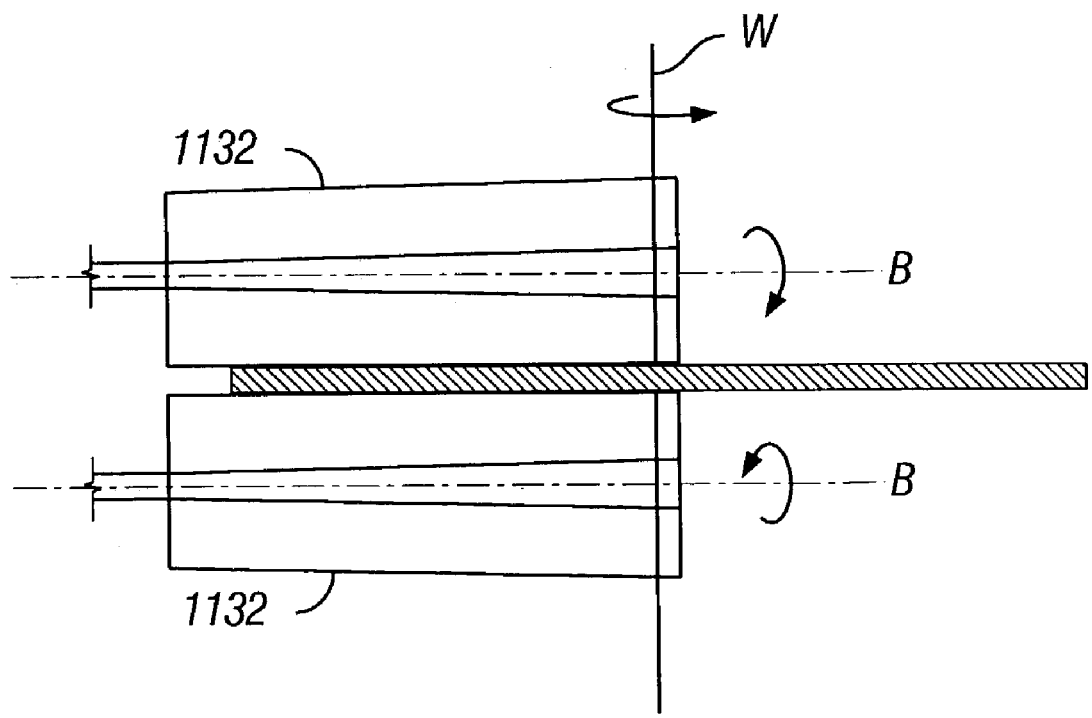

As shown in FIGS. 14A and 14B, in one embodiment, roller brushes are used. They may be cylindrical and a cleaning solution may be delivered through them. In this embodiment, the roller brushes 1132 may have a conical or tapered shape. In one manufacturing method, a brush section 1400, which is cylindrical, is fitted onto a brush shaft 1410 that has conical shape, thereby taking the shape of the shaft. This configuration eliminates the cleaning differential between the slow moving central region and the fast moving edge region of a workpiece or the wafer during brush cleaning. With conventional cylindrical roller brushes, cleaning of the slow moving central region of the wafer takes longer time. This cleaning differential may be avoided if a roller brush is able to exert more pressure on the central region than the edge region. This may be provided by making the brush conical so that a first end 1420 of the brush that touches the central region of the wafer applies more pressure and speeds up the cleaning. A second end 1430 of the brush is narrower, thus exerts less pressure to the edge region of the wafer. Force applied onto the central region compensates the cleaning difference that occurs due to the difference in velocities of edge and central regions of the wafer.

Figure 15:
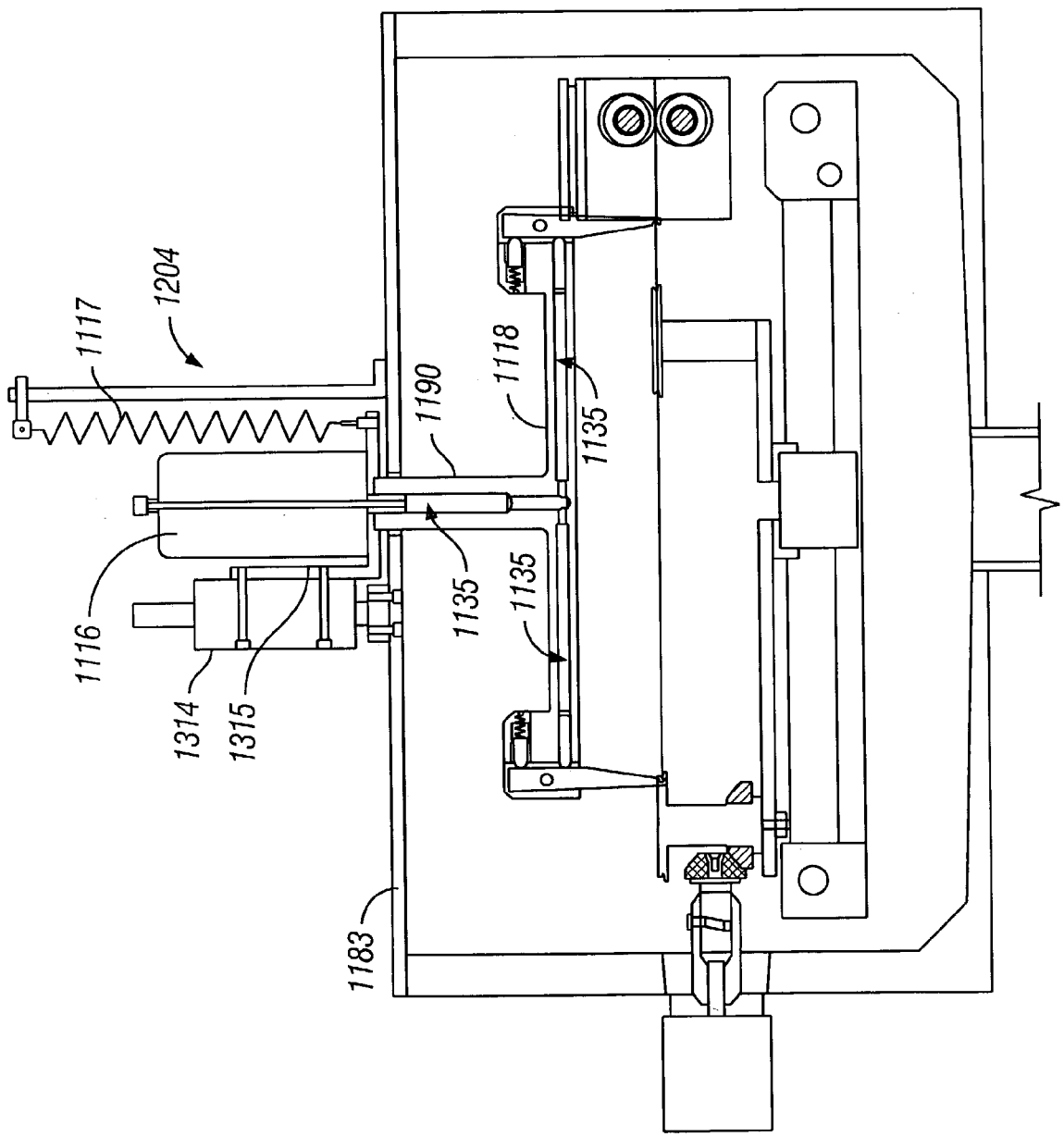
FIG. 15 is a schematic illustration of the chemical treatment/cleaning/rinsing-drying module of the present invention wherein the wafer is being picked up by a drying spindle after the wafer is cleaned.

FIG. 15 shows the details of the moving assembly of the spinner 1202. In FIG. 15, the spinner is in fully extended position to pick up the wafer for drying process from the movable housing after the chemical treatment, cleaning and rinsing steps of the process. The drive motor 1116 of the spinner is installed on the platform 1315 that is further attached to the air cylinder 1314. The air cylinder 1314 moves the drive motor 1116 and the spinner vertically up and down. The drive motor 1116 is attached to an upper end of the shaft 1190 of the spinner. Spring 1117 is also attached to the platform 1315 for balance purposes.

Figure 16:
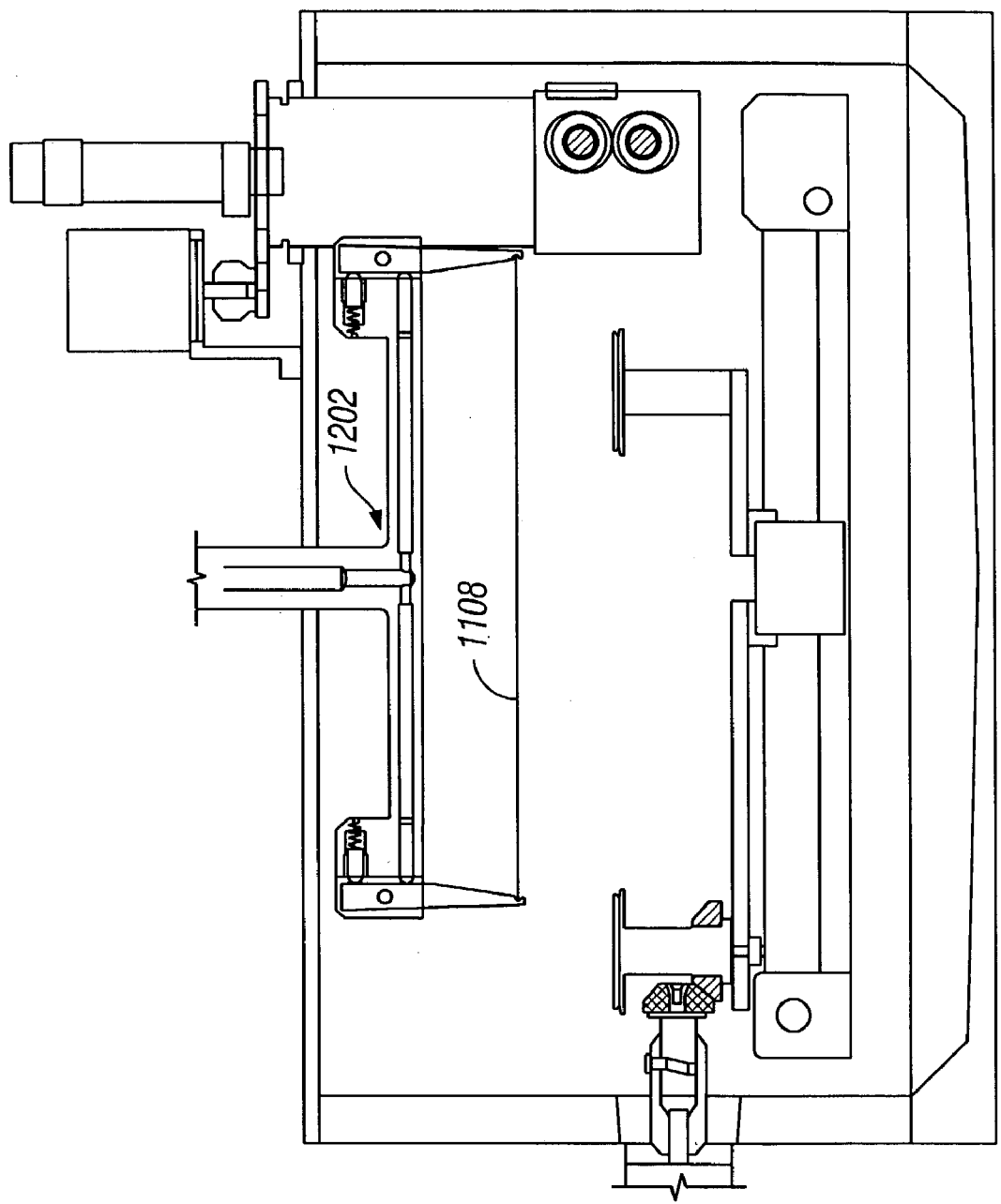
FIG. 16 is a schematic illustration of a chemical treatment/cleaning/rinsing-drying module of the of the present invention wherein a wafer is spin dried by the drying spindle of the module.

FIG. 16 shows the module 1104 in side view in which the spinner 1202 has picked up the wafer 1108 and fully retracted to spin dry the wafer 1180. During operation, once plating or polishing is completed, the movable housing 1106 receives the workpiece on three holding spools installed on supports 1111. As described earlier, the supports 1111 are attached to the bars 1110 and the center portion 1109. As soon as a sensor (not shown) senses that the workpiece 1108 is positioned on the holding spools, the workpiece 1108 is secured, and the movable housing 1106 is moved into the module 1104 through the opening 1123. The door 1113 makes contact with the side wall of module 1104 and adjusts itself to provide a proper seal. The movable housing 1106 then positions itself in the center of the module 1104.

When the movable housing 1106 is properly positioned, the drive support gear engages with the gear on the plunger. The rotation of the drive support causes the workpiece 1108 to rotate. When the workpiece 1108 is rotating, cleaning rolls 1132 can then make contact with the top and bottom surfaces of the workpiece 1108 to begin the chemical treatment/cleaning/rinsing-drying process. Although it may be applied in different order, the process may include a chemical treatment first step, a second step of brush and megasonic cleaning and a third step of DI rinsing followed by spin drying. The chemical treatment step may be performed by spraying acidic or basic solutions from the nozzles to clean the wafer. The nature of the solution depends on the material to be cleaned. The chemical treatment solution may also contain a passivating agent (for corrosion prevention). A passivation step may also be performed using a passivation solution. For example, for post CMP copper cleaning of wafers, citric acid may be used to clean wafers. In this example, a passivating agent such as BTA may be used with the chemical treatment solution or rinsing water or by itself. Rollers and the megasonic nozzle may be used during the chemical treatment or after the treatment as a separate cleaning step. After the chemical treatment, brush and megasonic cleaning, the wafer 1108 can be rinsed using de-ionized water, as discussed earlier. The passivation agent may also be added to the rinsing water.

After the workpiece 1108 is rinsed, a drying process is required. Before the drying process, rotation mechanism is disengaged from the movable housing to stop rotating the wafer. Clamps 1136 are used to pick up the workpiece from the spools of the supports 1111. The spinner moves downward and compressed air is delivered to the spinning wheel 1118. The pushers 1122' then push the clamps 1136 to an "open" position. Simultaneously, the center portion 1109 opens to release the workpiece 1108. When air is shut off, the pushers 1122' push the clamps 1136, thereby forcing them to contract on the workpiece 1108. Afterwards, spinning wheel 1118 with the workpiece 1108 is moved vertically upwardly and the wheel 1118 and the workpiece 1108 are spun. After the workpiece 1108 is dried, an outside robotic arm from location 1140 (FIG. 10) engages the workpiece 1108 so it can be transferred out of the module 1104.

As shown in FIG. 17, a plurality of chemical treatment/cleaning/rinsing-drying modules, made as described above, may form a system 1500. The system 1500 may comprise a cassette section 1502, a buffer 1504, a wafer handling area 1505 and chemical treatment/cleaning/rinsing-drying modules 1506A–1506F. In this embodiment, the robot 1508 in the wafer handling area moves the wafers from the buffer 1504 into one of the chemical treatment/cleaning/rinsing-drying modules. The first robot 1510 disposed within the cassette section 1502 will move the wafers from their cassette to the buffer 1504. In this embodiment location of the chemical treatment/cleaning/rinsing-drying modules may be configured side by side as in the manner shown in FIG. 17, or any other configuration for example the modules may be stacked on top of each other.

Although various preferred embodiments have been described in detail above, those skilled in the art will readily appreciate that many modifications of the exemplary embodiment are possible without materially departing from the novel teachings and advantages of this invention.

We claim:

1. A method of cleaning and drying a workpiece in a process module having a cleaning and drying section and a process section, comprising:
   placing the workpiece on a movable housing;
   moving the movable housing into the cleaning and drying section of the process module;
   cleaning a surface of the workpiece using a cleaning fluid in the cleaning and drying section;
   transferring the workpiece from the moveable housing to a drying mechanism having a spinning wheel; and
   drying the workpiece.

2. The method of claim 1 further comprising processing the surface of the workpiece in the process section adjacent the cleaning and drying section of the process module prior to the step of placing.

3. The method of claim 2 further comprising transporting the workpiece to the process module on another movable housing.

4. The method of claim 2 wherein, the steps of processing, placing, moving, cleaning, transferring and drying are performed while the surface of the workpiece faces down.

5. The method of claim 2, wherein the processing step comprises chemical mechanical polishing.

6. The method of claim 2, wherein the processing step comprises electrochemical mechanical processing.

7. The method of claim 1 further comprising rotating the workpiece using a workpiece rotating mechanism while applying the step of cleaning.

8. The method of claim 1 further comprising drying the workpiece by rotating the spinning wheel.

9. An apparatus for processing, cleaning and drying a semiconductor workpiece, the apparatus comprising:
a process area to process a surface of the workpiece;
a movable housing to transport the workpiece from the process area to a cleaning and drying area, wherein the movable housing has a support structure adapted to hold the workpiece, wherein the support structure comprises a plurality of supports having at least two idle supports and one drive support; and
a cleaning mechanism for receiving the workpiece from the moveable housing and for drying the workpiece.

10. The apparatus of claim 9, wherein the drive support is connected to a workpiece rotating mechanism for rotating the workpiece.

11. An apparatus for processing, cleaning and drying a semiconductor workpiece, the apparatus comprising:
a process area to process a surface of the workpiece;
a movable housing to transport the workpiece from the process area to a cleaning and drying area, wherein the movable housing has a support structure adapted to hold the workpiece; and
a cleaning mechanism for receiving the workpiece from the moveable housing and for drying the workpiece, wherein the workpiece is held and cleaned on the movable housing while the surface of the workpiece faces down.

12. The apparatus of claim 11, wherein the drying mechanism receives and dries the wafer while the surface of the workpiece faces down.

13. An apparatus for processing a workpiece, comprising:
a movable housing having a plurality of supports;
a plurality of holding spools for holding the workpiece during a cleaning process, wherein each holding spool is connected to one of the plurality of supports;
means for rotating the plurality of supports such that the workpiece is rotated during the cleaning process;
a rotatable wafer transport device for receiving the workpiece from the movable housing so that the workpiece can be dried during a drying process, the transport device having clamps and a release mechanism for securing and releasing the workpiece; and
means for rotating the workpiece during the drying process.

14. A system for operating upon a wafer comprising:
a wafer handling area which receives the wafer;
a first processing module having a chemical mechanical processing apparatus which chemically mechanically polishes the wafer, the first processing module includes a cleaning and drying apparatus which cleans and dries the wafer;
a first movable input housing which moves the wafer between the wafer handling area and the first processing module; and
a second moveable housing which moves the wafer between the chemical mechanical processing apparatus and the cleaning and drying apparatus.

15. The system of claim 14 further comprising:
a wafer buffer area in proximity to an exit of the cleaning and drying apparatus of the first processing module;
a wafer receiving area in proximity of the wafer buffer area; and
a first wafer handling robot wherein:
the second movable housing transfers the wafer from the cleaning and drying apparatus of the first processing module to the wafer buffer area; and
the first wafer handling robot transfers the wafer from the wafer buffer area to the wafer receiving area.

16. The system of claim 15 wherein the wafer receiving area is configurable to receive a cassette capable of holding a plurality of wafers.

* * * * *